(12) United States Patent
Jung et al.

(10) Patent No.: US 12,302,704 B2
(45) Date of Patent: May 13, 2025

(54) TRANSISTOR AND DISPLAY DEVICE INCLUDING THE SAME

(71) Applicant: Samsung Display Co., Ltd., Yongin-Si (KR)

(72) Inventors: Hyunggi Jung, Cheonan-si (KR); Yongduck Son, Seongnam-si (KR); Soon Chang Yeon, Seongnam-si (KR); Younghoon Yoo, Asan-si (KR); Jaemin Lee, Asan-si (KR); Dogi Lim, Asan-si (KR); Soojin Jeong, Hwaseong-si (KR); Hyungtae Jung, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 518 days.

(21) Appl. No.: 17/700,195

(22) Filed: Mar. 21, 2022

(65) Prior Publication Data
US 2022/0415986 A1    Dec. 29, 2022

(30) Foreign Application Priority Data

Jun. 28, 2021    (KR) .......................... 10-2021-0084061

(51) Int. Cl.
| | |
|---|---|
| *H01L 27/32* | (2006.01) |
| *H10K 59/121* | (2023.01) |
| *H10K 59/126* | (2023.01) |
| *H01L 27/12* | (2006.01) |
| *H01L 29/786* | (2006.01) |

(52) U.S. Cl.
CPC ....... *H10K 59/1213* (2023.02); *H10K 59/126* (2023.02); *H01L 27/1225* (2013.01); *H01L 29/78633* (2013.01); *H01L 29/7869* (2013.01)

(58) Field of Classification Search
CPC .............. H01L 27/0266; H01L 27/124; H01L 27/0288; H01L 27/0296; H01L 27/0688; H01L 29/7869
See application file for complete search history.

(56) References Cited

U.S. PATENT DOCUMENTS

| | | | | |
|---|---|---|---|---|
| 9,997,514 | B2* | 6/2018 | Yamazaki | ............ G09G 3/3283 |
| 2012/0268849 | A1* | 10/2012 | Tomatsu | ............. H01L 27/0266 |
| | | | | 327/566 |
| 2013/0002312 | A1* | 1/2013 | Yamazaki | ........... H01L 27/0266 |
| | | | | 327/109 |
| 2019/0198597 | A1* | 6/2019 | Kim | .................... H10K 59/1213 |

FOREIGN PATENT DOCUMENTS

KR    10-0576872 B1    5/2006

* cited by examiner

*Primary Examiner* — Jaehwan Oh
(74) *Attorney, Agent, or Firm* — Innovation Counsel LLP

(57) ABSTRACT

A transistor is disclosed that includes a substrate, an active layer, a gate electrode, a first electrode, a second electrode, and a first connection electrode. The active includes a first region, a second region, and a channel region between the first region and the second region. The gate electrode is disposed on the active layer and overlaps the channel region. The first electrode is disposed on the substrate and electrically connects to the first region. The second electrode is disposed on the substrate and electrically connects to the second region. The first connection electrode is disposed on the substrate and electrically connects the gate electrode and the second electrode.

23 Claims, 20 Drawing Sheets

TRANSISTOR AND DISPLAY DEVICE INCLUDING THE SAME

CROSS-REFERENCE TO RELATED APPLICATION(S)

This application claims priority under 35 USC § 119 to Korean Patent Application No. 10-2021-0084061 filed on Jun. 28, 2021 in the Korean Intellectual Property Office (KIPO), the entire disclosure of which is incorporated by reference herein.

BACKGROUND

1. Field

Embodiments relate to a transistor. More particularly, embodiments relate to a diode-connected transistor and a display device including the transistor.

2. Description of the Related Art

A display device may include a plurality of pixels and a plurality of lines providing signals to the pixels. When static electricity flowing into the display device is transmitted to the pixels through the lines, elements included in the pixels may be damaged by the static electricity.

In order to prevent damage to the elements included in the pixels due to the static electricity, the display device may include a discharge diode connected to the lines. The discharge diode may be implemented as a diode-connected transistor. The discharge diode may discharge static electricity flowing into the display device. However, the discharge diode may be damaged when the static electricity passes through the discharge diode.

SUMMARY

A transistor according to an embodiment may include a substrate, an active layer disposed on the substrate and including a first region, a second region, and a channel region between the first region and the second region, a gate electrode disposed on the active layer, the gate electrode overlapping the channel region, a first electrode disposed on the substrate, the first electrode being electrically connected to the first region, a second electrode disposed on the substrate, the second electrode being electrically connected to the second region, and a first connection electrode disposed on the substrate and electrically connecting the gate electrode and the second electrode.

In an embodiment, the first connection electrode may be disposed at a same layer as the active layer.

In an embodiment, the first connection electrode may include an oxide semiconductor.

In an embodiment, the transistor may further include a second connection electrode disposed on the gate electrode, the second connection electrode contacting the first connection electrode and the gate electrode.

In an embodiment, the first connection electrode may contact the second connection electrode and the second electrode.

In an embodiment, the second connection electrode may be disposed at the same layer as the second electrode.

In an embodiment, the second connection electrode may be disposed on the second electrode.

In an embodiment, the transistor may further include a dummy pattern disposed at a same layer as the gate electrode, the dummy pattern overlapping a portion of the first connection electrode.

In an embodiment, an impurity may not be doped in the portion of the first connection electrode.

In an embodiment, the first connection electrode may be disposed on the second electrode.

In an embodiment, the first connection electrode may include a transparent conductive oxide.

In an embodiment, the first connection electrode may contact the gate electrode and the second electrode.

In an embodiment, the transistor may further include a second connection electrode disposed at a same layer as the second electrode, the second connection electrode contacting the gate electrode and the first connection electrode.

In an embodiment, the first connection electrode may contact the second connection electrode and the second electrode.

In an embodiment, a resistance of the first connection electrode may be greater than a resistance of the gate electrode.

A display device according to an embodiment may include a display portion including a substrate and a plurality of pixels disposed on the substrate, a driver configured to provide a driving signal to the display portion, a controller configured to provide a control signal to the driver, and a transistor connected to a connection line connecting the display portion and the driver or connecting the driver and the controller. The transistor may include an active layer disposed on the substrate and including a first region, a second region, and a channel region between the first region and the second region, a gate electrode disposed on the active layer, the gate electrode overlapping the channel region, a first electrode disposed on the substrate, the first electrode being electrically connected to the first region, a second electrode disposed on the substrate, the second electrode being electrically connected to the second region, and a first connection electrode disposed on the substrate and electrically connecting the gate electrode and the second electrode.

In an embodiment, a resistance of the first connection electrode may be greater than a resistance of the gate electrode.

In an embodiment, one of the first electrode and the second electrode may be connected to the connection line, and the other of the first electrode and the second electrode may be connected to a power voltage line configured to provide a power voltage to the plurality of pixels.

In an embodiment, each of the plurality of pixels may include a pixel electrode disposed on the second electrode, an emission layer disposed on the pixel electrode, and an opposite electrode disposed on the emission layer.

In an embodiment, the transistor may further include a second connection electrode disposed on the gate electrode, the second connection electrode contacting the first connection electrode and the gate electrode.

In an embodiment, the first connection electrode may be disposed at the same layer as the active layer, and the second connection electrode may be disposed at the same layer as the second electrode.

In an embodiment, the first connection electrode may be disposed at the same layer as the active layer, and the second connection electrode may be disposed at the same layer as the pixel electrode.

In an embodiment, the first connection electrode may be disposed at the same layer as the pixel electrode, and the second connection electrode may be disposed at the same layer as the second electrode.

In an embodiment, the first connection electrode may be disposed at the same layer as the pixel electrode.

The transistor according to the embodiments may include the first connection electrode electrically connecting the gate electrode and the second electrode and having a relatively large resistance, so that the transistor may not be damaged by static electricity.

In an embodiment, the first connection electrode is disposed at a same layer as the active layer or on the second electrode.

BRIEF DESCRIPTION OF THE DRAWINGS

Illustrative, non-limiting embodiments will be more clearly understood from the following detailed description taken in conjunction with the accompanying drawings.

DETAILED DESCRIPTION OF THE EMBODIMENTS

The display device according to the embodiments may include a transistor which is not damaged by static electricity and discharges the static electricity, so that static electricity may not flow into the pixels of the display device. Accordingly, the display device may not be damaged by static electricity.

Hereinafter, transistors and display devices in accordance with embodiments will be explained in detail with reference to the accompanying drawings.

Figure 1:
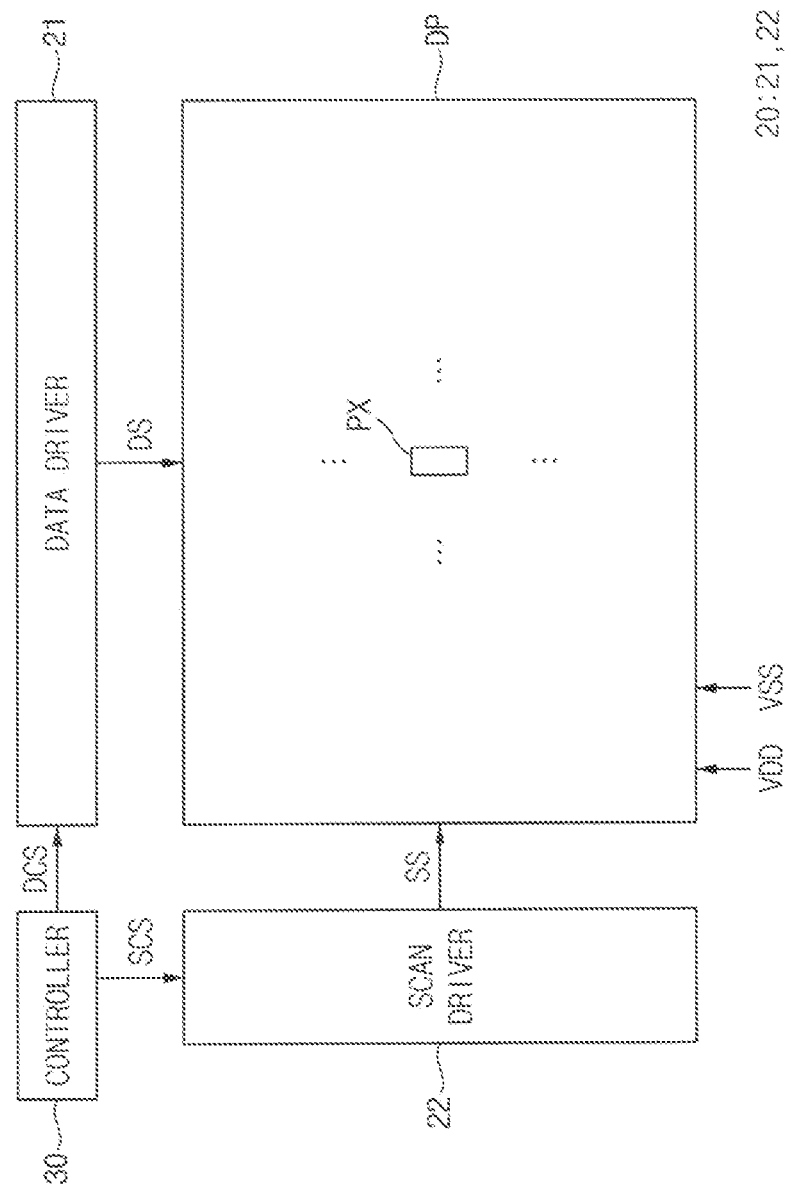
FIG. 1 is a block diagram illustrating a display device according to an embodiment.

FIG. 1 is a block diagram illustrating a display device according to an embodiment.

Referring to FIG. 1, the display device may include a display portion DP, a driver 20, and a controller 30.

The display portion DP may include a plurality of pixels PX. The display portion DP may display an image based on light emitted from the pixels PX.

The driver 20 may provide a driving signal to the display portion DP. The pixels PX may generate light based on the driving signal.

In an embodiment, the driver 20 may include a data driver 21 and a scan driver 22. The data driver 21 may provide a data signal DS to the display portion DP. The scan driver 22 may provide a scan signal SS to the display portion DP.

The controller 30 may provide a control signal to the driver 20. The driver 20 may generate the driving signal based on the control signal.

In an embodiment, the controller 30 may provide a data control signal DCS to the data driver 21, and may provide a scan control signal SCS to the scan driver 22. The data driver 21 may generate the data signal DS based on the data control signal DCS, and the scan driver 22 may generate the scan signal SS based on the scan control signal SCS.

A power voltage may be provided to the display portion DP. The power voltage may include a first power voltage VDD and a second power voltage VSS. The first power voltage VDD and the second power voltage VSS may be provided to each of the pixels PX. In an embodiment, a voltage level of the first power voltage VDD may be higher than a voltage level of the second power voltage VSS.

Figure 2:
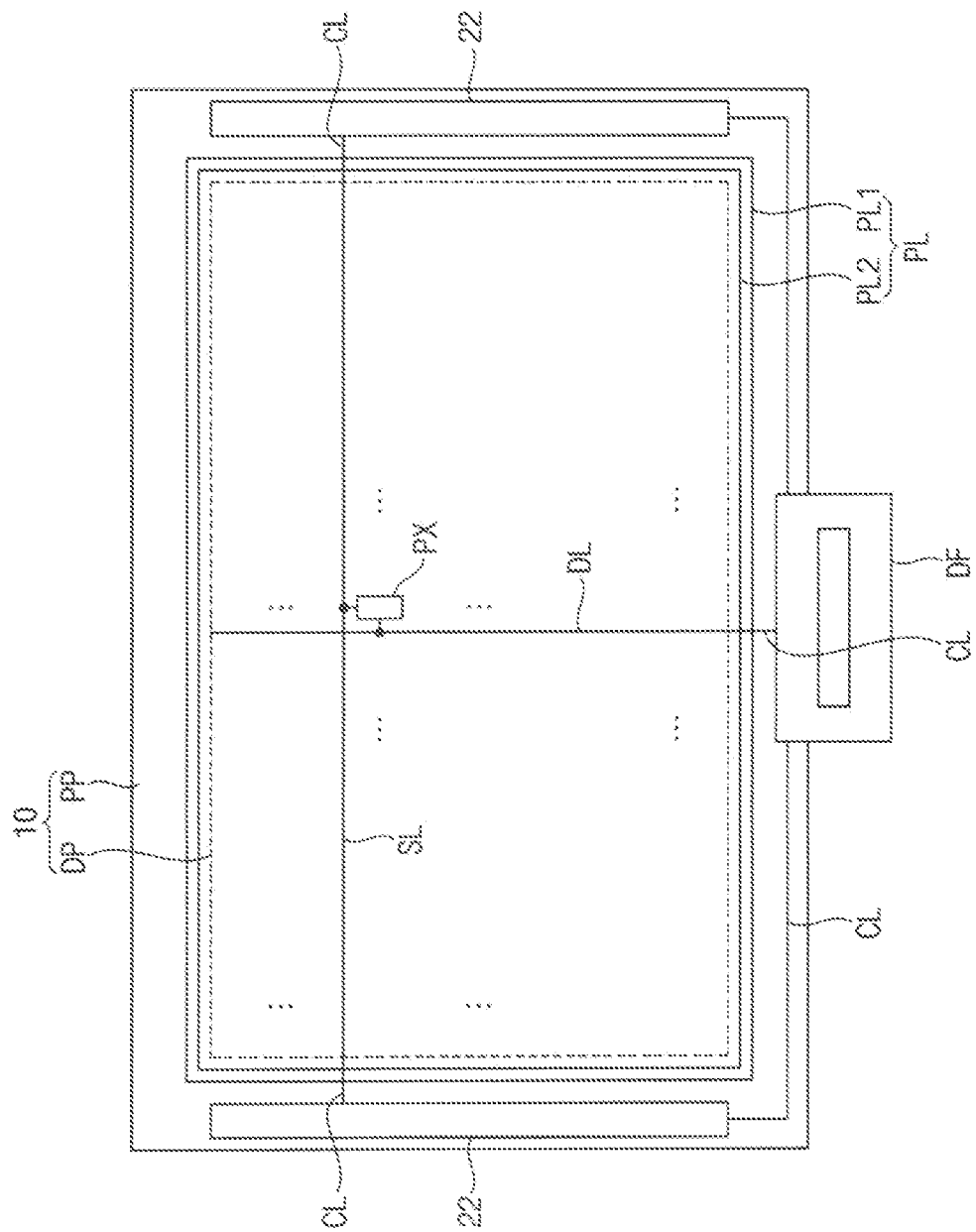
FIG. 2 is a plan view illustrating a display device according to an embodiment.

FIG. 2 is a plan view illustrating a display device according to an embodiment.

Referring to FIGS. 1 and 2, the display device may include a display panel 10 and a driving film DF.

The display panel 10 may include the display portion DP and a peripheral portion PP. The peripheral portion PP may be adjacent to the display portion DP. In an embodiment, the peripheral portion PP may surround the display portion DP.

The display portion DP may include data lines DL and scan lines SL. The pixels PX may be connected to the data lines DL and the scan lines SL. The data lines DL may transmit the data signal DS, and the scan lines SL may transmit the scan signal SS. In an embodiment, the data lines DL and the scan lines SL may extend in directions intersecting each other.

The peripheral portion PP may include power voltage lines PL. The power voltage lines PL may include a first power voltage line PL1 and a second power voltage line PL2. The first power voltage line PL1 may transmit the first power voltage VDD, and the second power voltage line PL2 may transmit the second power voltage VSS.

The driving film DF may be connected to the peripheral portion PP of the display panel 10. The driving film DF may include a driving chip such as an integrated circuit (IC) chip or the like.

In an embodiment, the scan driver 22 may be disposed in the peripheral portion PP of the display panel 10, and the driving film DF may include the data driver 21 and the controller 30.

A connection line CL connecting the display portion DP and the driver 20 or connecting the driver 20 and the controller 30 may be disposed in the peripheral portion PP of the display panel 10. In an embodiment, the connection line CL may connect the scan line SL to the scan driver 22, the data line DL to the data driver 21, or the scan driver 22 to the controller 30.

Figure 3:
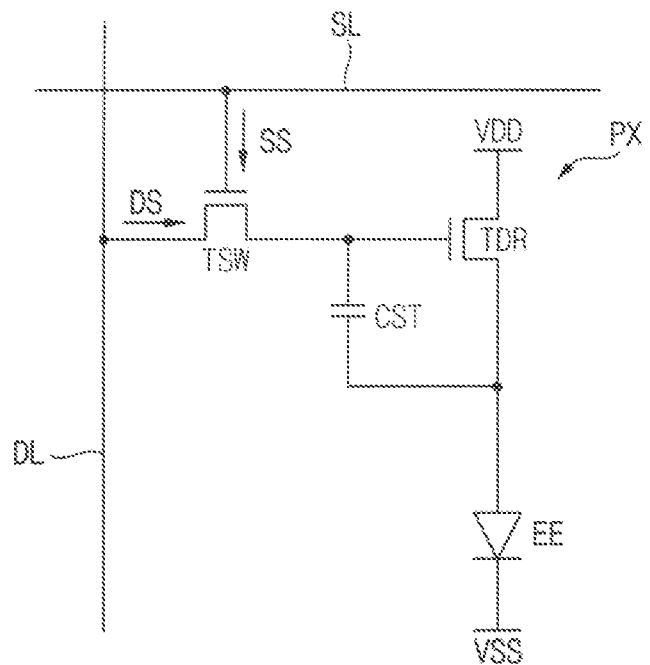
FIG. 3 is a circuit diagram illustrating a pixel included in a display device according to an embodiment.

FIG. 3 is a circuit diagram illustrating a pixel PX included in a display device according to an embodiment.

Referring to FIG. 3, the pixel PX may be connected to the data line DL and the scan line SL. The pixel PX may include a driving transistor TDR, a switching transistor TSW, a storage capacitor CST, and a light emitting element EE.

A first electrode of the switching transistor TSW may receive the data signal DS, and a second electrode of the switching transistor TSW may be connected to the driving transistor TDR. A gate electrode of the switching transistor TSW may receive the scan signal SS. The switching transistor TSW may provide the data signal DS to the driving transistor TDR in response to the scan signal SS.

A first electrode of the driving transistor TDR may receive the first power voltage VDD, and a second electrode of the driving transistor TDR may be connected to the light emitting element EE. A gate electrode of the driving transistor TDR may be connected to the second electrode of the switching transistor TSW. The driving transistor TDR may generate a driving current corresponding to a voltage stored in the storage capacitor CST using the first power voltage VDD, and may provide the driving current to the light emitting element EE.

In FIG. 3, although each of the switching transistor TSW and the driving transistor TDR is illustrated as an NMOS transistor, at least one of the switching transistor TSW and the driving transistor TDR may be a PMOS transistor. The first electrode of each of the switching transistor TSW and the driving transistor TDR may be one of a source electrode and a drain electrode, and the second electrode of each of the switching transistor TSW and the driving transistor TDR may be the other of the source electrode and the drain electrode.

The storage capacitor CST may be connected between the gate electrode of the driving transistor TDR and the second electrode of the driving transistor TDR. The storage capacitor CST may store a voltage corresponding to the data signal DS.

The first electrode of the light emitting element EE may be connected to the second electrode of the driving transistor TDR, and the second electrode of the light emitting element EE may receive the second power voltage VSS. The light emitting element EE may emit light based on the driving current.

In FIG. 3, although the pixel PX including two transistors and one capacitor is illustrated, however, components of the pixel PX are not limited thereto. The pixel PX may include three or more transistors and may include two or more capacitors.

Figure 4:
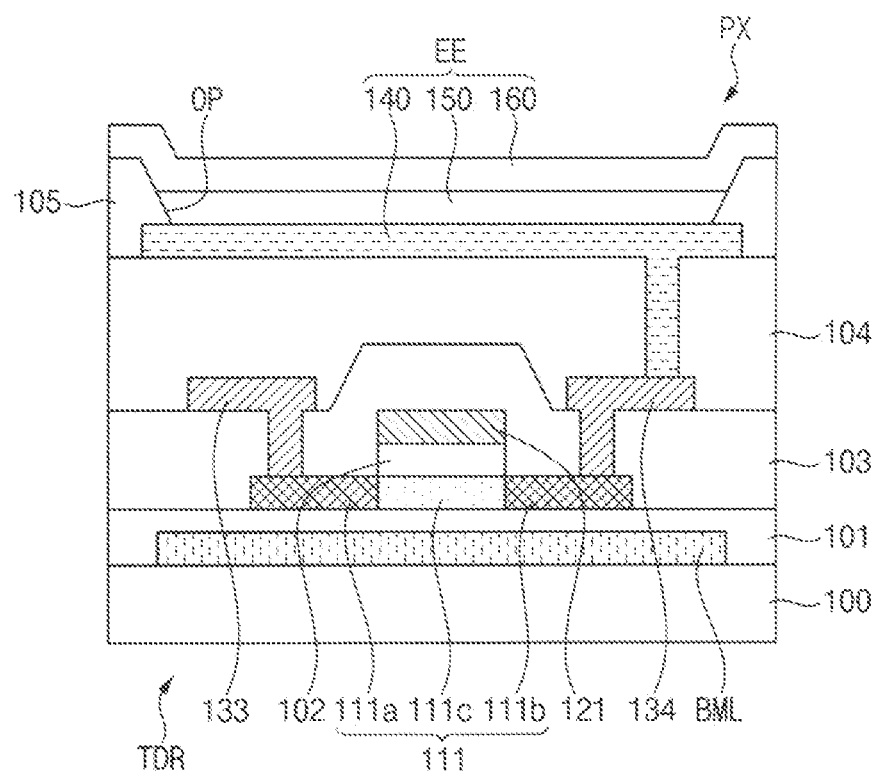
FIG. 4 is a cross-sectional view illustrating the pixel in FIG. 3.

FIG. 4 is a cross-sectional view illustrating the pixel PX in FIG. 3.

Referring to FIG. 4, the pixel PX may include a substrate 100, transistors disposed on the substrate 100 and including the driving transistor TDR, and the light emitting element EE connected to the driving transistor TDR. The driving transistor TDR may include an active layer 111, a gate electrode 121, a first electrode 133, and a second electrode 134. The light emitting element EE may include a pixel electrode 140, an emission layer 150, and an opposite electrode 160.

The substrate 100 may include glass, plastic, metal, or the like.

A light blocking layer BML may be disposed on the substrate 100. The light blocking layer BML may block external light from being introduced into the active layer 111. In an embodiment, the light blocking layer BML may include a metal. For example, the metal may include molybdenum (Mo), aluminum (Al), copper (Cu), titanium (Ti), or the like.

A buffer layer 101 may be disposed on the light blocking layer BML. The buffer layer 101 may cover the light blocking layer BML on the substrate 100. The buffer layer 101 may block impurities from flowing into the active layer 111, and may planarize a portion over the substrate 100. In an embodiment, the buffer layer 101 may include an inorganic insulating material. For example, the inorganic insulating material may include silicon oxide, silicon nitride, silicon oxynitride, or the like.

The active layer 111 may be disposed on the buffer layer 101. In an embodiment, the active layer 111 may include an oxide semiconductor. The oxide semiconductor may include an oxide of at least one selected from the group of indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). In another embodiment, the active layer 111 may include amorphous silicon, polycrystalline silicon, or the like.

The active layer 111 may include a first region 111a, a second region 111b, and a channel region 111c. The second region 111b may be spaced apart from the first region 111a. The channel region 111c may be disposed between the first region 111a and the second region 111b. Each of the first region 111a and the second region 111b may be doped with impurities, and the channel region 111c may not be doped with the impurities. In an embodiment, the impurities may be N-type impurities. For example, the N-type impurities may include phosphorus (P), arsenic (As), antimony (Sb), or the like. In another embodiment, the impurities may be P-type impurities.

A gate insulating layer 102 may be disposed on the active layer 111. In an embodiment, the gate insulating layer 102 may include an inorganic insulating material. For example, the inorganic insulating material may include silicon oxide, silicon nitride, silicon oxynitride, or the like.

The gate electrode 121 may be disposed on the gate insulating layer 102. The gate electrode 121 may overlap the channel region 111c of the active layer 111. In an embodiment, the gate electrode 121 may include a metal. For example, the metal may include molybdenum (Mo), aluminum (Al), copper (Cu), titanium (Ti), or the like. The gate electrode 121 may have a single-layer structure or a multi-layer structure.

An interlayer insulating layer 103 may be disposed on the gate electrode 121. The interlayer insulating layer 103 may cover the active layer 111 and the gate electrode 121 on the buffer layer 101. In an embodiment, the interlayer insulating layer 103 may include an inorganic insulating material. For example, the inorganic insulating material may include silicon oxide, silicon nitride, silicon oxynitride, or the like.

The first electrode 133 may be disposed on the interlayer insulating layer 103. The first electrode 133 may be electrically connected to the first region 111a of the active layer 111. In an embodiment, the first electrode 133 may contact the first region 111a of the active layer 111 through a contact hole penetrating the interlayer insulating layer 103.

The second electrode 134 may be disposed on the interlayer insulating layer 103. The second electrode 134 may be electrically connected to the second region 111b of the active layer 111. In an embodiment, the second electrode 134 may contact the second region 111b of the active layer 111 through a contact hole penetrating the interlayer insulating layer 103.

In an embodiment, each of the first electrode 133 and the second electrode 134 may include a metal. For example, the metal may include molybdenum (Mo), aluminum (Al), copper (Cu), titanium (Ti), or the like. Each of the first electrode 133 and the second electrode 134 may have a single-layer structure or a multilayer structure.

A planarization layer 104 may be disposed on the first electrode 133 and the second electrode 134. The planarization layer 104 may cover the first electrode 133 and the second electrode 134 on the interlayer insulating layer 103. The planarization layer 104 may have a flat upper surface. In an embodiment, the planarization layer 104 may include an organic insulating material and/or an inorganic insulating material.

The pixel electrode 140 may be disposed on the planarization layer 104. The pixel electrode 140 may be electrically connected to the second electrode 134. In an embodiment, the pixel electrode 140 may contact the second electrode 134 through a contact hole penetrating the planarization layer 104.

In an embodiment, the pixel electrode 140 may include a transparent conductive oxide. For example, the transparent conductive oxide may include at least one selected from the group including indium-tin oxide (ITO), indium-zinc oxide (IZO), indium oxide (InO), indium-gallium oxide (IGO), and aluminum-zinc oxide (AZO).

In an embodiment, the pixel electrode 140 may further include a metal as well as the transparent conductive oxide. For example, the metal may include at least one selected from the group including silver (Ag), magnesium (Mg), aluminum (Al), platinum (Pt), lead (Pd), gold (Au), nickel (Ni), niobium (Nd), iridium (Jr), and chromium (Cr).

A pixel defining layer 105 may be disposed on the pixel electrode 140. The pixel defining layer 105 may cover the pixel electrode 140 on the planarization layer 104. The pixel defining layer 105 may have an opening OP exposing at least a portion of the pixel electrode 140. The opening OP may define an area in which the pixel PX is disposed in a plan view. In an embodiment, the opening OP may expose a central portion of the pixel electrode 140, and the pixel defining layer 105 may cover an edge of the pixel electrode 140. In an embodiment, the pixel defining layer 105 may include an organic insulating material and/or an inorganic insulating material.

The emission layer 150 may be disposed on the pixel electrode 140. The emission layer 150 may be disposed on the pixel electrode 140 exposed by the opening OP of the pixel defining layer 105. The emission layer 150 may include at least one of an organic light emitting material and a quantum dot.

In an embodiment, the organic light emitting material may include a low molecular weight organic compound or a high molecular weight organic compound. For example, the low molecular weight organic compound may include copper phthalocyanine, N,N'-diphenylbenzidine, tris-(8-hydroxyquinoline)aluminum, etc., and the high molecular weight organic compound may include poly(3,4-ethylenedioxythiophene), polyaniline, poly-phenylenevinylene, polyfluorene, etc.

In an embodiment, the quantum dot may include a core including a group II-VI compound, a group III-V compound, a group IV-VI compound, a group IV element, a group IV compound, and combinations thereof. In an embodiment, the quantum dot may have a core-shell structure including the core and a shell surrounding the core. The shell may serve as a protective layer for maintaining semiconductor properties by preventing chemical modification of the core and as a charging layer for imparting electrophoretic properties to the quantum dot.

The opposite electrode 160 may be disposed on the emission layer 150 and the pixel defining layer 105. In an embodiment, the opposite electrode 160 may include a metal. For example, the metal may include at least one selected from the group including silver (Ag), magnesium (Mg), aluminum (Al), platinum (Pt), lead (Pd), gold (Au), nickel (Ni), niobium (Nd), iridium (Jr), chromium (Cr), lithium (Li), and calcium (Ca).

Figure 5:
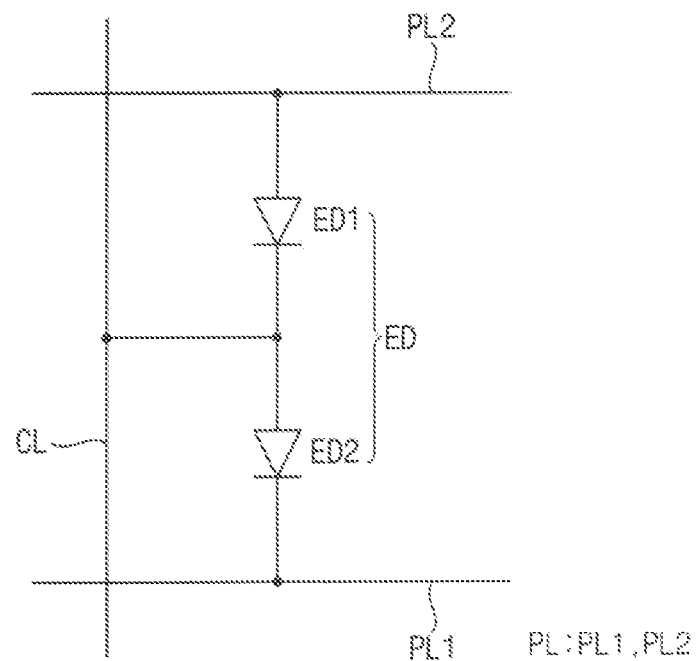
FIG. 5 is a diagram illustrating discharge diodes included in a display device according to an embodiment.

FIG. 5 is a diagram illustrating discharge diodes ED included in a display device according to an embodiment.

Referring to FIG. 5, a discharge diode ED may be connected to the connection line CL. When static electricity flows into the display portion DP through the connection line CL from the outside, the static electricity may damage elements in the display portion DP. For example, the gate insulating layer 102 of the transistor included in the pixel PX may be damaged by the static electricity. The discharge diode ED may discharge static electricity flowing into the connection line CL.

In an embodiment, one of a first electrode and a second electrode of the discharge diode ED may be connected to the connection line CL, and the other of the first electrode and the second electrode of the discharge diode ED may be connected to the power voltage line PL.

In an embodiment, the discharge diodes ED may include a first discharge diode ED1 and a second discharge diode ED2. A first electrode of the first discharge diode ED1 may be connected to the second power voltage line PL2, and a second electrode of the first discharge diode ED1 may be connected to the connection line CL. A first electrode of the second discharge diode ED2 may be connected to the connection line CL, and a second electrode of the second discharge diode ED2 may be connected to the first power voltage line PL1.

A voltage level of each of the driving signal and the control signal transmitted through the connection line CL may be higher than a voltage level of the second power voltage VSS, and may be lower than a voltage level of the first power voltage VDD. Accordingly, when the driving signal or the control signal is transmitted through the connection line CL, the first discharge diode ED1 and the second discharge diode ED2 may be turned off.

For example, when static electricity having a voltage level higher than the voltage level of the first power voltage VDD is introduced into the connection line CL, the second discharge diode ED2 may be turned on, and the static electricity may be discharged to the first power voltage line PL1 through the second discharge diode ED2. Further, when static electricity having a voltage level lower than the voltage level of the second power voltage VSS is introduced into the connection line CL, the first discharge diode ED1 may be turned on, and the static electricity may be discharged to the second power voltage line PL2 through the first discharge diode ED1.

Figure 6:
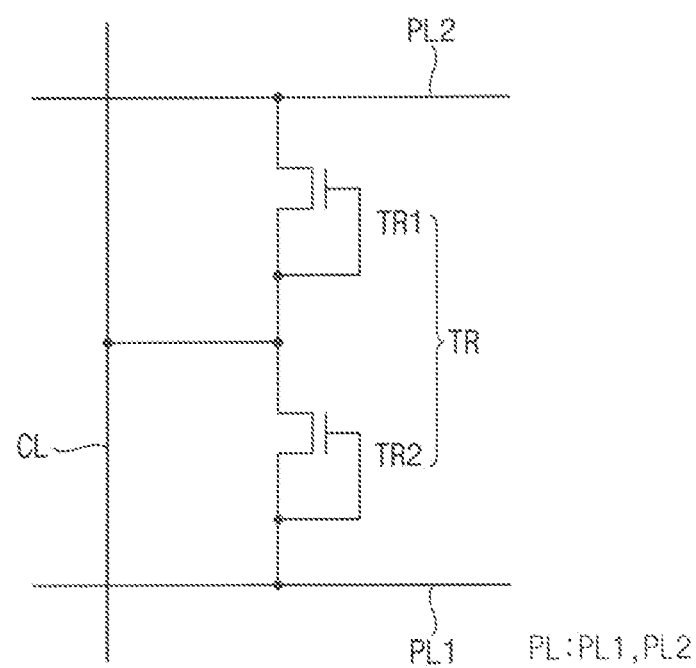
FIG. 6 is a circuit diagram illustrating transistors included in a display device according to an embodiment.

FIG. 6 is a circuit diagram illustrating transistors TR included in a display device according to an embodiment.

Referring to FIGS. 5 and 6, the discharge diode ED may include a transistor TR in which a second electrode and a gate electrode are connected. When the second electrode and the gate electrode of the transistor TR are connected, the transistor TR may operate as a diode. The transistor TR in which the second electrode and the gate electrode are connected may be referred to as a diode-connected transistor.

In an embodiment, one of a first electrode and a second electrode of the transistor TR may be connected to the connection line CL, and the other of the first electrode and the second electrode of the transistor TR may be connected to the power voltage line PL.

In an embodiment, the first discharge diode ED1 may include a first transistor TR1, and the second discharge diode ED2 may include a second transistor TR2. A first electrode of the first transistor TR1 may be connected to the second power voltage line PL2, a second electrode of the first transistor TR1 may be connected to the connection line CL, and a gate electrode of the first transistor TR1 may be connected to the second electrode of the first transistor TR1. The first electrode of the second transistor TR2 may be connected to the connection line CL, the second electrode of the second transistor TR2 may be connected to the first power voltage line PL1, and a gate electrode of the second transistor TR2 may be connected to the second electrode of the second transistor TR2.

In FIG. 6, although the transistor TR is illustrated as an NMOS transistor, however, the transistor TR may be a PMOS transistor. The first electrode of the transistor TR may be one of a source electrode and a drain electrode, and the second electrode of the transistor TR may be the other of the source electrode and the drain electrode.

Figure 7:
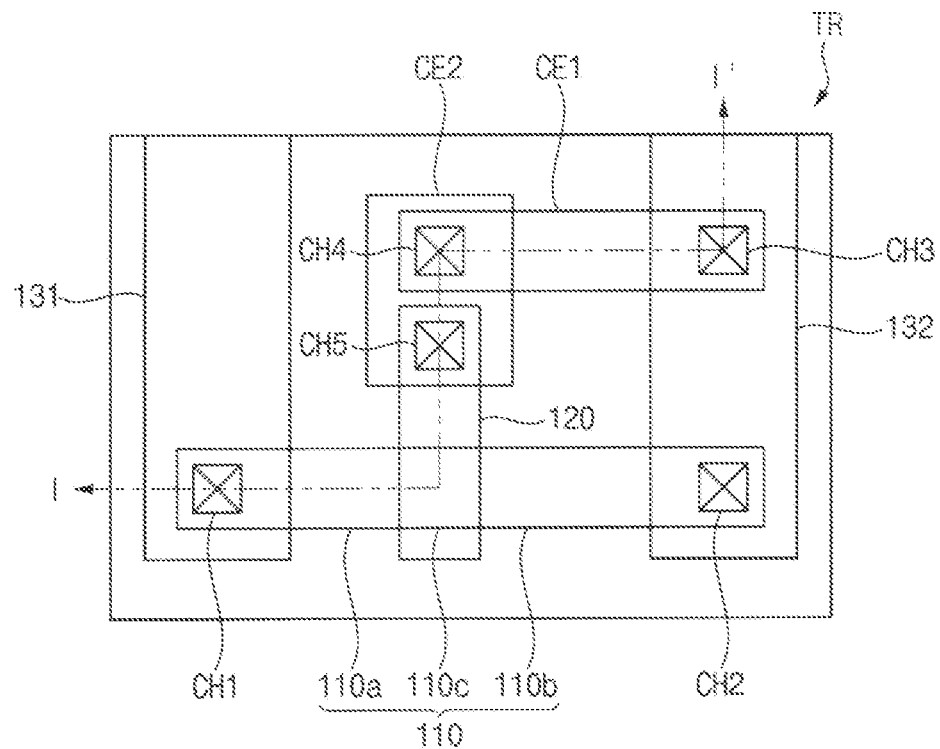
FIG. 7 is a plan view illustrating a transistor according to an embodiment.
Figure 8:
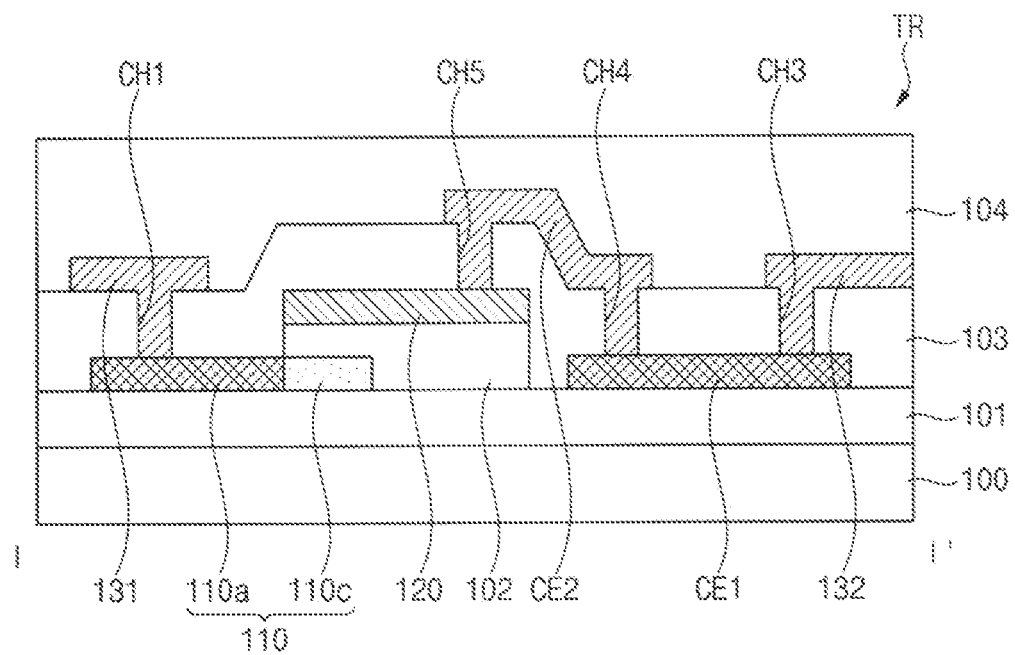
FIG. 8 is a cross-sectional view illustrating the transistor taken along a line I-I' in FIG. 7.

FIG. 7 is a plan view illustrating a transistor according to an embodiment. FIG. 8 is a cross-sectional view illustrating the transistor taken along a line I-I' in FIG. 7.

Referring to FIGS. 7 and 8, the transistor TR may include an active layer 110, a gate electrode 120, a first electrode 131, a second electrode 132, a first connection electrode CE1, and a second connection electrode CE2.

The active layer 110 may be disposed on the buffer layer 101. In an embodiment, the active layer 110 may include an oxide semiconductor. The oxide semiconductor may include an oxide of at least one selected from the group including indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the oxide semiconductor may include at least one of zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). In another embodiment, the active layer 110 may include amorphous silicon, polycrystalline silicon, or the like.

The active layer 110 may include a first region 110a, a second region 110b, and a channel region 110c. The second region 110b may be spaced apart from the first region 110a. The channel region 110c may be disposed between the first region 110a and the second region 110b. Each of the first region 110a and the second region 110b may be doped with impurities, and the channel region 110c may not be doped with the impurities. In an embodiment, the impurities may be N-type impurities. For example, the N-type impurities may include phosphorus (P), arsenic (As), antimony (Sb), or the like. In another embodiment, the impurities may be P-type impurities.

The gate electrode 120 may be disposed on the gate insulating layer 102. The gate electrode 120 may overlap the channel region 110c of the active layer 110. In an embodiment, the gate electrode 120 may include a metal. For example, the metal may include molybdenum (Mo), aluminum (Al), copper (Cu), titanium (Ti), or the like. The gate electrode 120 may have a single-layer structure or a multilayer structure.

The first electrode 131 may be disposed on the interlayer insulating layer 103. The first electrode 131 may be electrically connected to the first region 110a of the active layer 110. In an embodiment, the first electrode 131 may contact the first region 110a of the active layer 110 through a first contact hole CH1 penetrating the interlayer insulating layer 103.

The second electrode 132 may be disposed on the interlayer insulating layer 103. The second electrode 132 may be electrically connected to the second region 110b of the active layer 110. In an embodiment, the second electrode 132 may contact the second region 110b of the active layer 110 through a second contact hole CH2 penetrating the interlayer insulating layer 103.

In an embodiment, each of the first electrode 131 and the second electrode 132 may include a metal. For example, the metal may include molybdenum (Mo), aluminum (Al), copper (Cu), titanium (Ti), or the like. Each of the first electrode 131 and the second electrode 132 may have a single-layer structure or a multilayer structure.

The first connection electrode CE1 may be disposed at the same layer as the active layer 110. In other words, the first connection electrode CE1 may be disposed on the buffer layer 101. The first connection electrode CE1 may electrically connect the gate electrode 120 and the second electrode 132. In an embodiment, the second electrode 132 may contact the first connection electrode CE1 through a third contact hole CH3 penetrating the interlayer insulating layer 103.

In an embodiment, the first connection electrode CE1 may include an oxide semiconductor. The oxide semiconductor may include an oxide of at least one selected from the group including indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the oxide semiconductor may include zinc oxide (ZnO), zinc-tin oxide (ZTO), zinc-indium oxide (ZIO), indium oxide (InO), titanium oxide (TiO), indium-gallium-zinc oxide (IGZO), and indium-zinc-tin oxide (IZTO). In another embodiment, the first connection electrode CE1 may include amorphous silicon, polycrystalline silicon, or the like.

The first connection electrode CE1 may be doped with impurities. In an embodiment, the impurities may be N-type impurities. For example, the N-type impurities may include phosphorus (P), arsenic (As), antimony (Sb), or the like. In another embodiment, the impurities may be P-type impurities.

A resistance of the first connection electrode CE1 may be greater than a resistance of the gate electrode 120. In an embodiment, the first connection electrode CE1 may include an oxide semiconductor, and the gate electrode 120 may include a metal. In such an embodiment, since a resistivity of the oxide semiconductor is greater than a resistivity of the metal, the resistance of the first connection electrode CE1 may be greater than the resistance of the gate electrode 120.

The second connection electrode CE2 may be disposed at the same layer as the first electrode 131 and the second electrode 132. In other words, the second connection electrode CE2 may be disposed on the interlayer insulating layer 103. The second connection electrode CE2 may contact the first connection electrode CE1 through a fourth contact hole CH4 penetrating the interlayer insulating layer 103, and may contact the gate electrode 120 through a fifth contact hole CH5 penetrating the interlayer insulating layer 103.

In an embodiment, the second connection electrode CE2 may include a metal. For example, the metal may include molybdenum (Mo), aluminum (Al), copper (Cu), titanium (Ti), or the like. The second connection electrode CE2 may have a single-layer structure or a multilayer structure.

In a comparative example of the prior art, as the gate electrode of the transistor, which has a relatively small resistance, is directly connected to the second electrode, static electricity supplied to the second electrode may flow into the active layer through the second electrode, the gate electrode, and the gate insulating layer. In the comparative example, the gate electrode and the active layer may be electrically shorted by the static electricity, and accordingly, the transistor may be damaged by the static electricity.

In an embodiment of the present inventive concept, the gate electrode 120 and the second electrode 132 of the transistor TR are electrically connected by the first connection electrode CE1, which has a relatively large resistance. If static electricity is supplied to the second electrode 132, the static electricity may not flow into the active layer 110 through the second electrode 132, the gate electrode 120, and the gate insulating layer 102 because of the relatively large resistance of the first connection electrode CE1. Accordingly, the transistor TR may not be damaged by the static electricity.

FIGS. 9, 10, 11, 12, 13, 14, 15, and 16 are diagrams illustrating a method of manufacturing a transistor according to an embodiment. For example, FIGS. 9 to 16 may illustrate a method of manufacturing the transistor TR in FIGS. 7 and 8.

Figure 9:
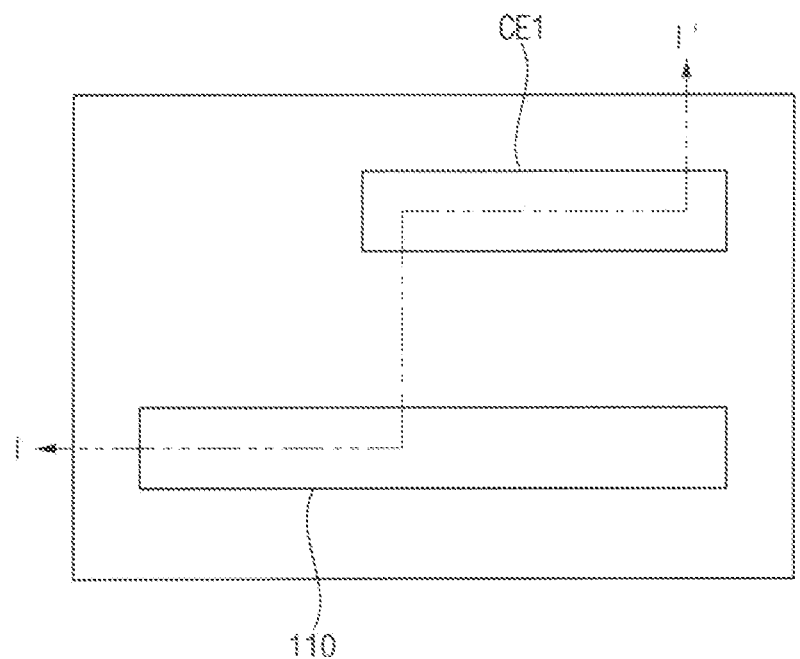
FIGS. 9, 10, 11, 12, 13, 14, 15, and 16 are diagrams illustrating a method of manufacturing a transistor according to an embodiment.
Figure 10:
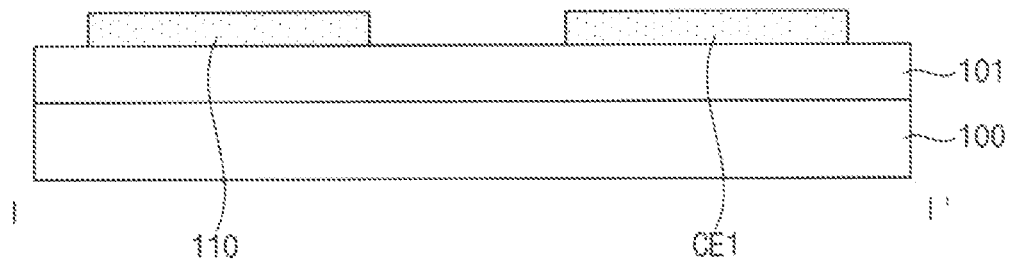

Referring to FIGS. 9 and 10, the active layer 110 and the first connection electrode CE1 may be formed on the buffer layer 101. The first connection electrode CE1 may be spaced apart from the active layer 110. In an embodiment, an oxide semiconductor layer may be formed on the buffer layer 101, and the oxide semiconductor layer may be patterned to substantially simultaneously form the active layer 110 and the first connection electrode CE1.

Figure 11:
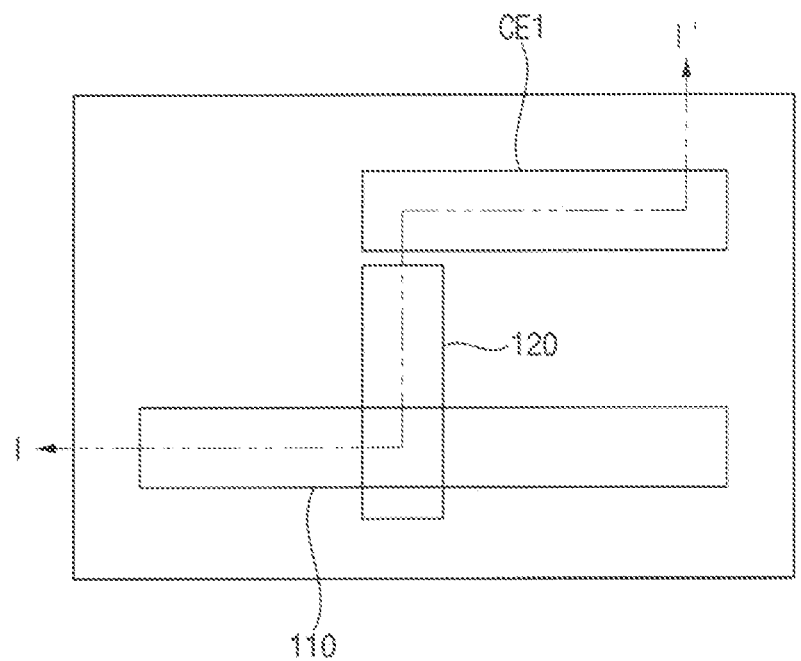
Figure 12:
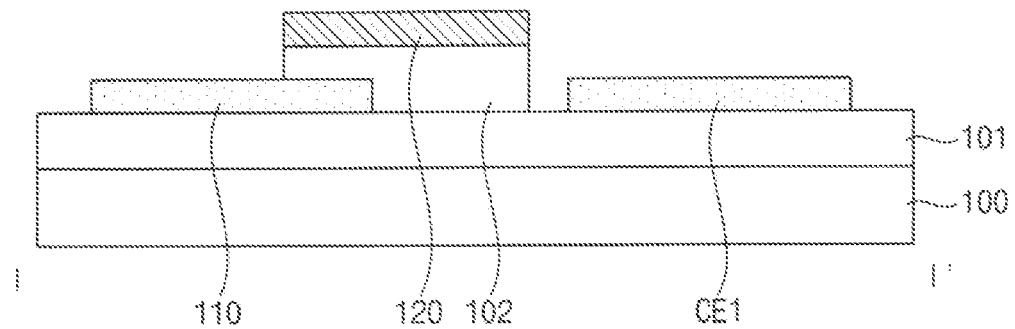

Referring to FIGS. 11 and 12, the gate insulating layer 102 and the gate electrode 120 may be formed on the active layer 110 and the first connection electrode CE1. In an embodiment, an insulating layer and a metal layer may be sequentially formed on the active layer 110 and the first connection electrode CE1, and the insulating layer and the metal layer may be patterned together to substantially simultaneously form the gate insulating layer 102 and the gate electrode 120.

Figure 13:
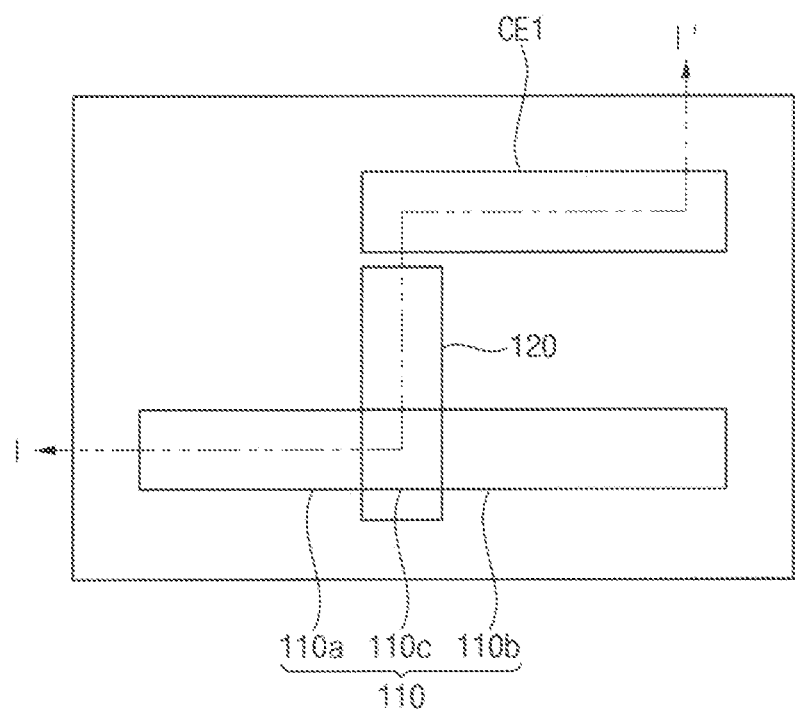
Figure 14:
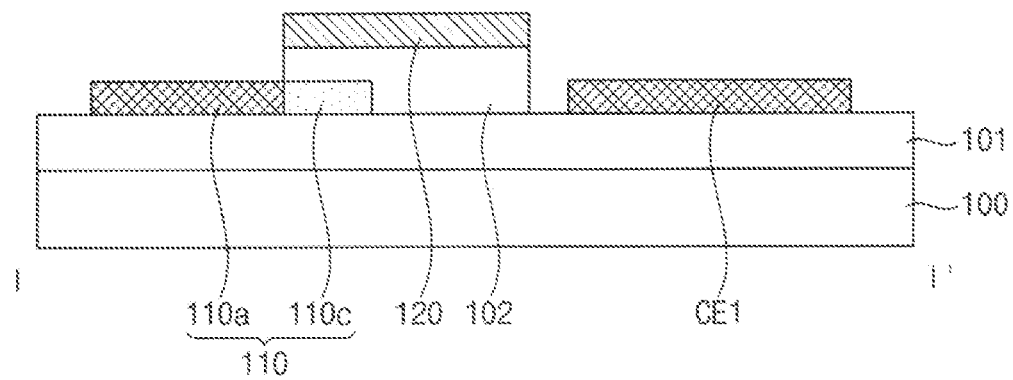

Referring to FIGS. 13 and 14, the active layer 110 and the first connection electrode CE1 may be doped with impurities. In an embodiment, N-type impurities may be doped into the active layer 110 and the first connection electrode CE1 using the gate electrode 120 as a mask. The impurities may be doped into the first region 110a and the second region 110b of the active layer 110 which do not overlap the gate electrode 120, and the impurities may not be doped into the channel region 110c of the active layer 110 which overlaps the gate electrode 120.

Figure 15:
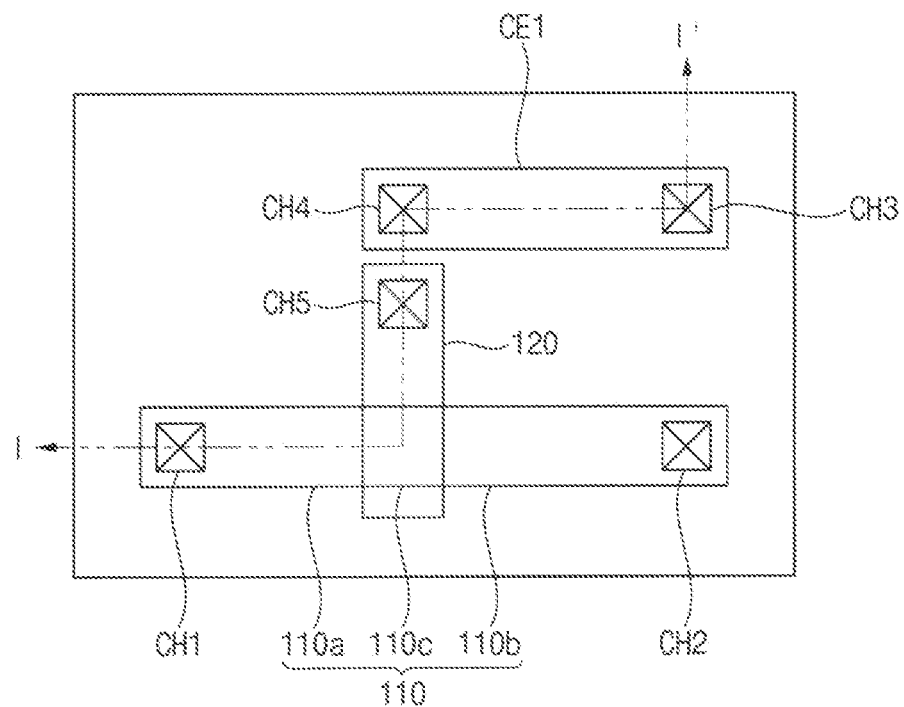
Figure 16:
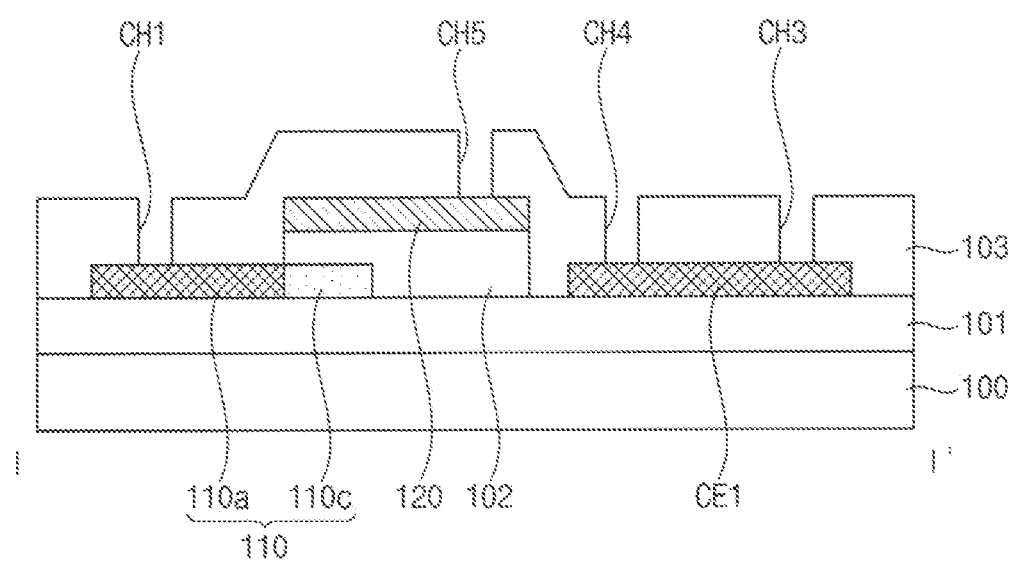

Referring to FIGS. 15 and 16, the interlayer insulating layer 103 may be formed on the gate electrode 120, and the first to fifth contact holes CH1 to CH5 penetrating the interlayer insulating layer 103 may be formed. The first contact hole CH1 may expose the first region 110a of the active layer 110, and the second contact hole CH2 may expose the second region 110b of the active layer 110. The third contact hole CH3 may expose a first end of the first connection electrode CE1, and the fourth contact hole CH4 may expose a second end of the first connection electrode CE1. The fifth contact hole CH5 may expose the gate electrode 120.

Referring to FIGS. 7 and 8, the first electrode 131, the second electrode 132, and the second connection electrode CE2 may be formed on the interlayer insulating layer 103. The first electrode 131 may contact the first region 110a of the active layer 110 through the first contact hole CH1. The second electrode 132 may contact the second region 110b of the active layer 110 through the second contact hole CH2, and may contact the first end of the first connection electrode CE1 through the third contact hole CH3. The second connection electrode CE2 may contact the second end of the first connection electrode CE1 through the fourth contact hole CH4, and may contact the gate electrode 120 through the fifth contact hole CH5. In an embodiment, a metal layer may be formed on the interlayer insulating layer 103, and the metal layer may be patterned to substantially simultaneously form the first electrode 131, the second electrode 132, and the second connection electrode CE2.

Figure 17:
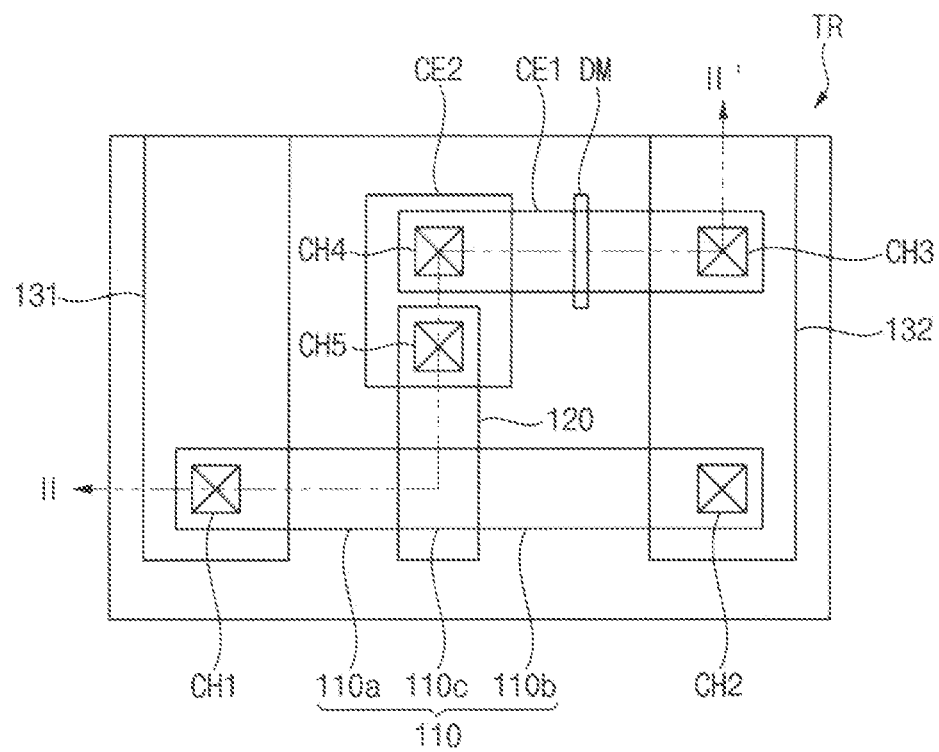
FIG. 17 is a plan view illustrating a transistor according to an embodiment.
Figure 18:
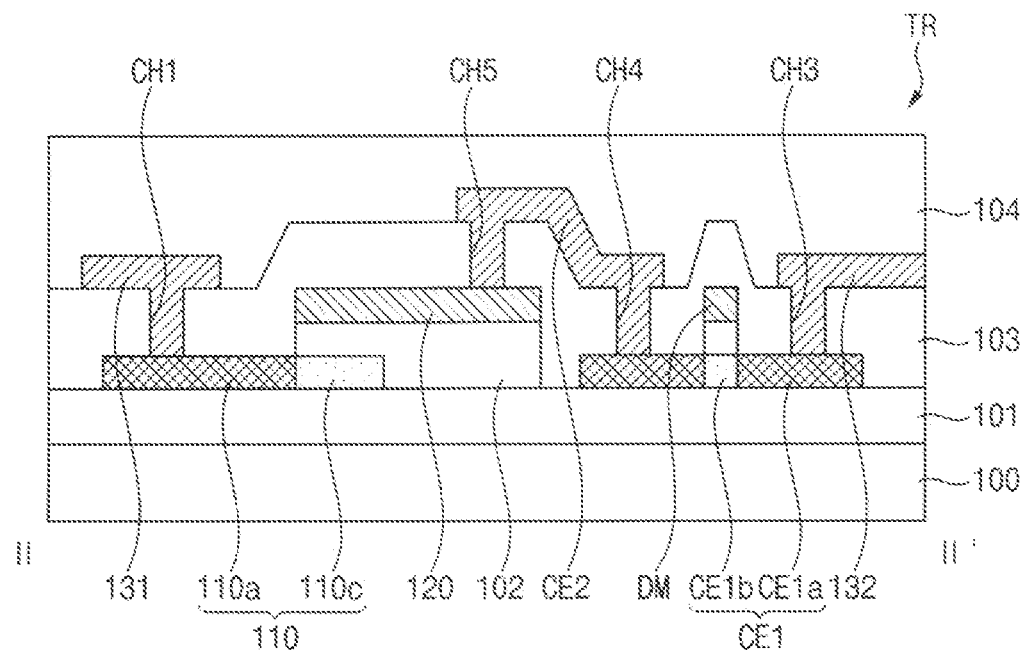
FIG. 18 is a cross-sectional view illustrating the transistor taken along a line II-II' in FIG. 17.

FIG. 17 is a plan view illustrating a transistor according to an embodiment. FIG. 18 is a cross-sectional view illustrating the transistor taken along a line II-IF in FIG. 17.

Referring to FIGS. 17 and 18, a transistor TR may include an active layer 110, a gate electrode 120, a first electrode 131, a second electrode 132, a first connection electrode CE1, a second connection electrode CE2, and a dummy pattern DM. The transistor TR described with reference to FIGS. 17 and 18 may be substantially the same as or similar to the transistor TR described with reference to FIGS. 7 and 8, except for further including the dummy pattern DM. Accordingly, descriptions of the overlapping components will be omitted.

The first connection electrode CE1 may include an impurity region CE1a and a non-impurity region CE1b. The impurity region CE1a may be doped with impurities, and the non-impurity region CE1b may not be doped with the impurities. In an embodiment, the impurities may be N-type impurities. For example, the N-type impurities may include phosphorus (P), arsenic (As), antimony (Sb), or the like. In another embodiment, the impurities may be P-type impurities.

A resistance of the non-impurity region CE1b may be greater than a resistance of the impurity region CE1a. As the impurities are doped into the impurity region CE1a, the resistance of the impurity region CE1a may decrease. Accordingly, the resistance of the impurity region CE1a may be less than the resistance of the non-impurity region CE1b into which the impurities are not doped.

The dummy pattern DM may be disposed at the same layer as the gate electrode 120. In other words, the dummy pattern DM may be disposed on the gate insulating layer 102. The dummy pattern DM may overlap a portion of the first connection electrode CE1. Specifically, the dummy pattern DM may overlap the non-impurity region CE1b of the first connection electrode CE1.

In an embodiment, the dummy pattern DM may include a metal. For example, the metal may include molybdenum (Mo), aluminum (Al), copper (Cu), titanium (Ti), or the like. The dummy pattern DM may have a single-layer structure or a multilayer structure.

In the present embodiment, as the first connection electrode CE1 includes the non-impurity region CE1b having a relatively high resistance, the resistance of the first connection electrode CE1 may increase. Accordingly, as the gate electrode 120 and the second electrode 132 of the transistor TR are electrically connected by the first connection electrode CE1 having a relatively large resistance, although static electricity is supplied to the second electrode 132, the static electricity may not flow into the active layer 110 through the second electrode 132, the gate electrode 120, and the gate insulating layer 102.

FIGS. 19, 20, 21, and 22 are diagrams illustrating a method of manufacturing a transistor according to an embodiment. For example, FIGS. 19 to 22 may illustrate a method of manufacturing the transistor TR in FIGS. 17 and 18. Descriptions of components of the method of manufacturing the transistor TR described with reference to FIGS. 19 to 22, which are substantially the same as or similar to those of the method of manufacturing the transistor TR described with reference to FIGS. 7 to 16, will be omitted.

Figure 19:
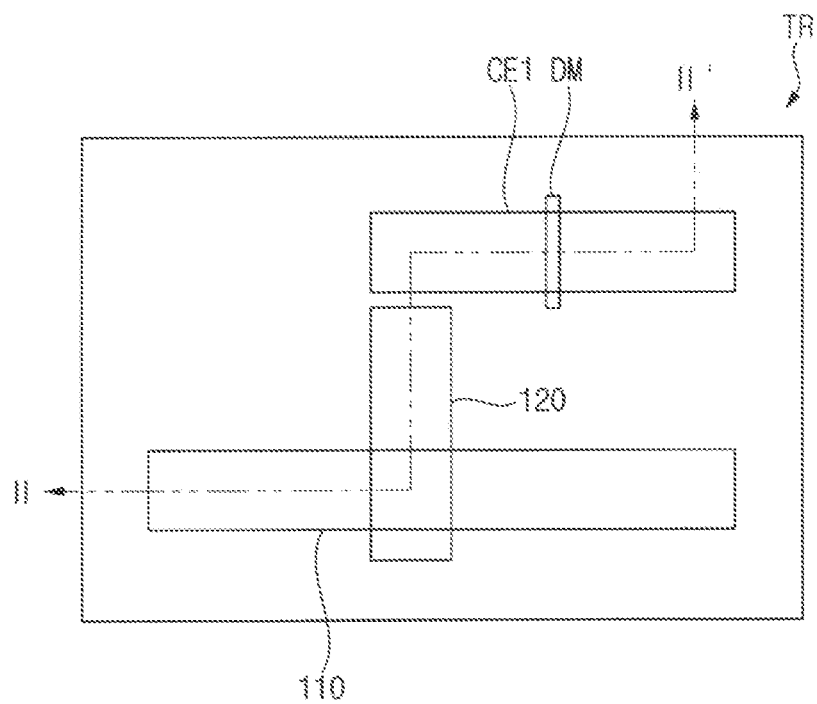
FIGS. 19, 20, 21, and 22 are diagrams illustrating a method of manufacturing a transistor according to an embodiment.
Figure 20:
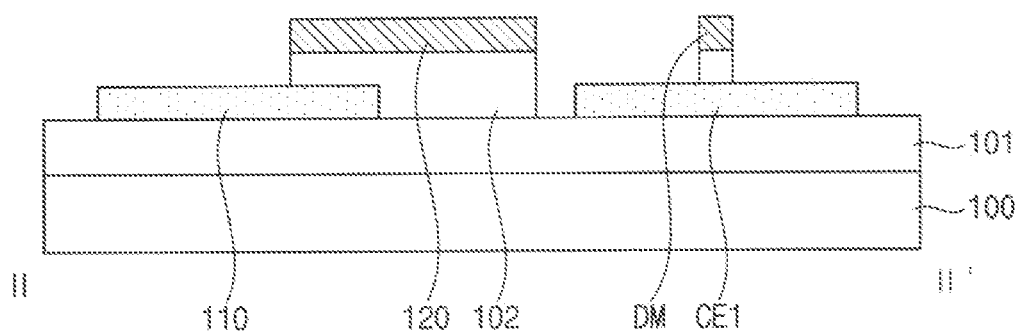

Referring to FIGS. 19 and 20, the gate insulating layer 102, the gate electrode 120, and the dummy pattern DM may be formed on the active layer 110 and the first connection electrode CE1. In an embodiment, an insulating layer and a metal layer may be sequentially formed on the active layer 110 and the first connection electrode CE1, and the insulating layer and the metal layer may be patterned together to substantially simultaneously form the gate insulating layer 102, the gate electrode 120, and the dummy pattern DM.

Figure 21:
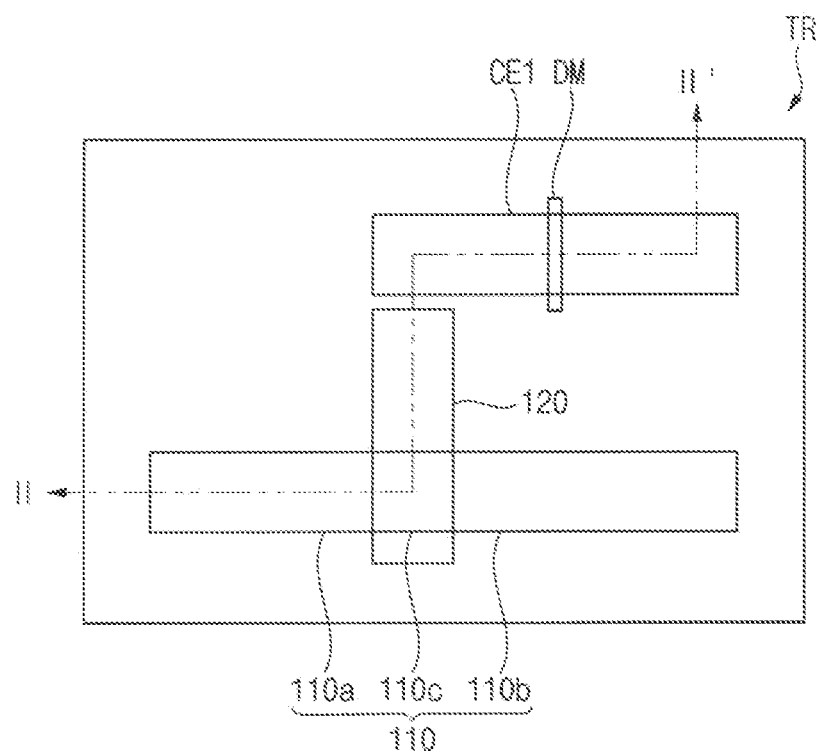
Figure 22:
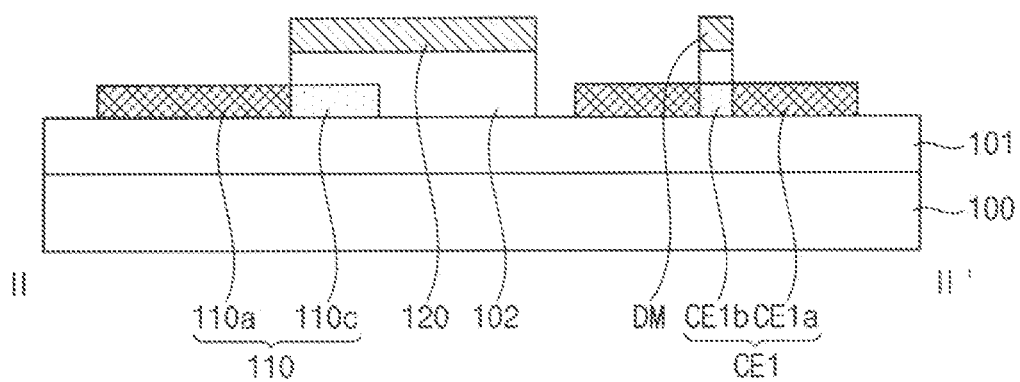

Referring to FIGS. 21 and 22, the active layer 110 and the first connection electrode CE1 may be doped with impurities. In an embodiment, N-type impurities may be doped into the active layer 110 and the first connection electrode CE1 by using the gate electrode 120 and the dummy pattern DM as a mask. The impurity region CE1a of the first connection electrode CE1, which does not overlap the dummy pattern DM, may be doped with the impurities, and the non-impurity region CE1b of the first connection electrode CE1, which overlaps the dummy pattern DM, may not be doped with the impurities.

Figure 23:
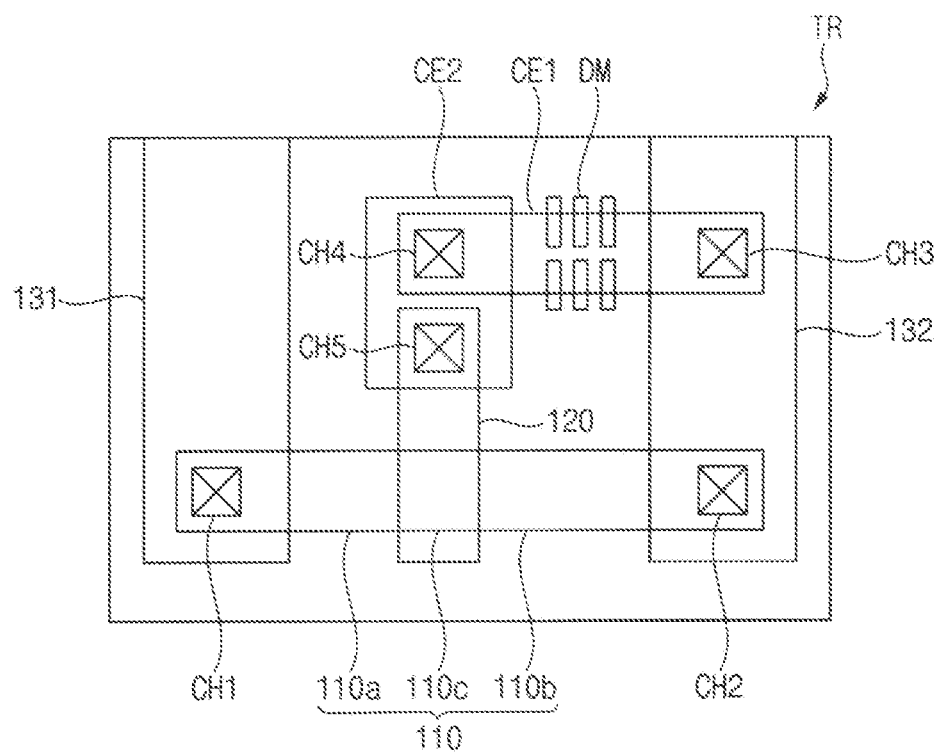
FIG. 23 is a plan view illustrating a transistor according to an embodiment.

FIG. 23 is a plan view illustrating a transistor according to an embodiment.

Referring to FIG. 23, a transistor TR may include an active layer 110, a gate electrode 120, a first electrode 131, a second electrode 132, a first connection electrode CE1, a second connection electrode CE2, and a plurality of dummy patterns DM. The transistor TR described with reference to FIG. 23 may be substantially the same as or similar to the transistor TR described with reference to FIGS. 17 and 18 except for including the plurality of dummy patterns DM. Accordingly, descriptions of the overlapping components will be omitted.

The dummy patterns DM may be disposed at the same layer as the gate electrode 120. Each of the dummy patterns DM may overlap a portion of the first connection electrode CE1. Impurities may not be doped into portions of the first connection electrode CE1 respectively overlapping the dummy patterns DM, and accordingly, the first connection electrode CE1 may include a plurality of non-impurity regions.

Figure 24:
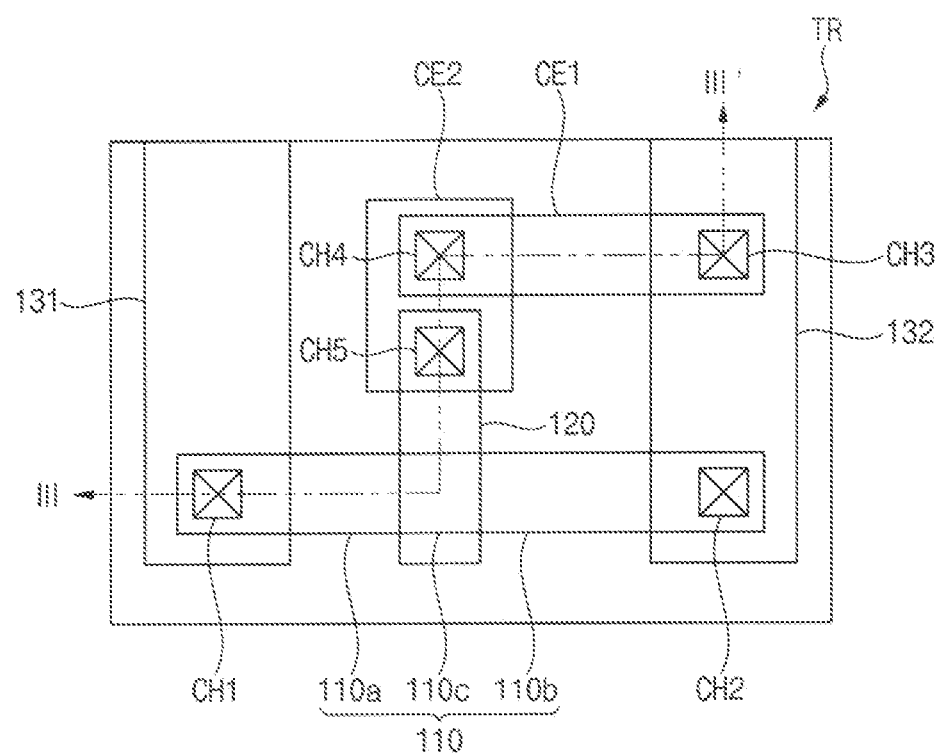
FIG. 24 is a plan view illustrating a transistor according to an embodiment.
Figure 25:
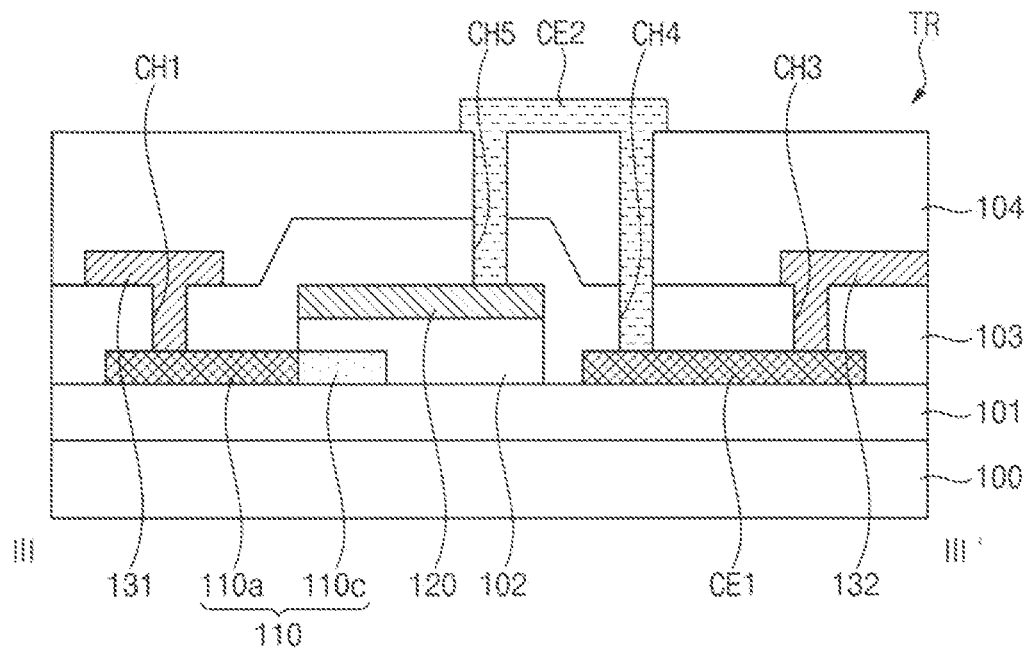
FIG. 25 is a cross-sectional view illustrating the transistor taken along a line III-III' in FIG. 24.

FIG. 24 is a plan view illustrating a transistor according to an embodiment. FIG. 25 is a cross-sectional view illustrating the transistor taken along a line III-III' in FIG. 24.

Referring to FIGS. 24 and 25, a transistor TR may include an active layer 110, a gate electrode 120, a first electrode 131, a second electrode 132, a first connection electrode CE1, and a second connection electrode CE2. The transistor TR described with reference to FIGS. 24 and 25 may be substantially the same as or similar to the transistor TR described with reference to FIGS. 7 and 8 except for the position of the second connection electrode CE2. Accordingly, descriptions of the overlapping components will be omitted.

The second connection electrode CE2 may be disposed on the first electrode 131 and the second electrode 132. In an embodiment, the second connection electrode CE2 may be disposed at the same layer as the pixel electrode 140 in FIG. 4. In other words, the second connection electrode CE2 may be disposed on the planarization layer 104. The second connection electrode CE2 may contact the first connection electrode CE1 through a fourth contact hole CH4 penetrating the planarization layer 104 and the interlayer insulating layer 103, and may contact the gate electrode 120 through a fifth contact hole CH5 penetrating the planarization layer 104 and the interlayer insulating layer 103.

In an embodiment, the second connection electrode CE2 may include a transparent conductive oxide. For example, the transparent conductive oxide may include at least one selected from the group including indium-tin oxide (ITO), indium-zinc oxide (IZO), indium oxide (InO), indium-gallium oxide (IGO), and aluminum-zinc oxide (AZO).

In an embodiment, the second connection electrode CE2 may further include a metal as well as the transparent conductive oxide. For example, the metal may include at least one selected from the group including silver (Ag), magnesium (Mg), aluminum (Al), platinum (Pt), lead (Pd), gold (Au), nickel (Ni), niobium (Nd), iridium (Jr), and chromium (Cr).

A resistance of the second connection electrode CE2 may be greater than a resistance of the gate electrode 120. In an embodiment, the second connection electrode CE2 may include a transparent conductive oxide, and the gate electrode 120 may include a metal. In such an embodiment, since a resistivity of the transparent conductive oxide is greater than a resistivity of the metal, the resistance of the second connection electrode CE2 may be greater than the resistance of the gate electrode 120.

In the embodiment of the present inventive concept, the gate electrode 120 and the second electrode 132 of the transistor TR may be electrically connected by the first connection electrode CE1 having a relatively large resistance and the second connection electrode CE2 having a relatively large resistance. Therefore, although static electricity is supplied to the second electrode 132, static electricity may not be introduced to the active layer 110 through the second electrode 132, the gate electrode 120, and the gate insulating layer 102. Accordingly, the transistor TR may not be damaged by the static electricity.

FIGS. 26, 27, 28, 29, 30, and 31 are diagrams illustrating a method of manufacturing a transistor according to an embodiment. For example, FIGS. 26 to 31 may illustrate a method of manufacturing the transistor TR in FIGS. 24 and 25. Descriptions of components of the method of manufacturing the transistor TR described with reference to FIGS. 24 to 31, which are substantially the same as or similar to those of the method of manufacturing the transistor TR described with reference to FIGS. 7 to 16, will be omitted.

Figure 26:
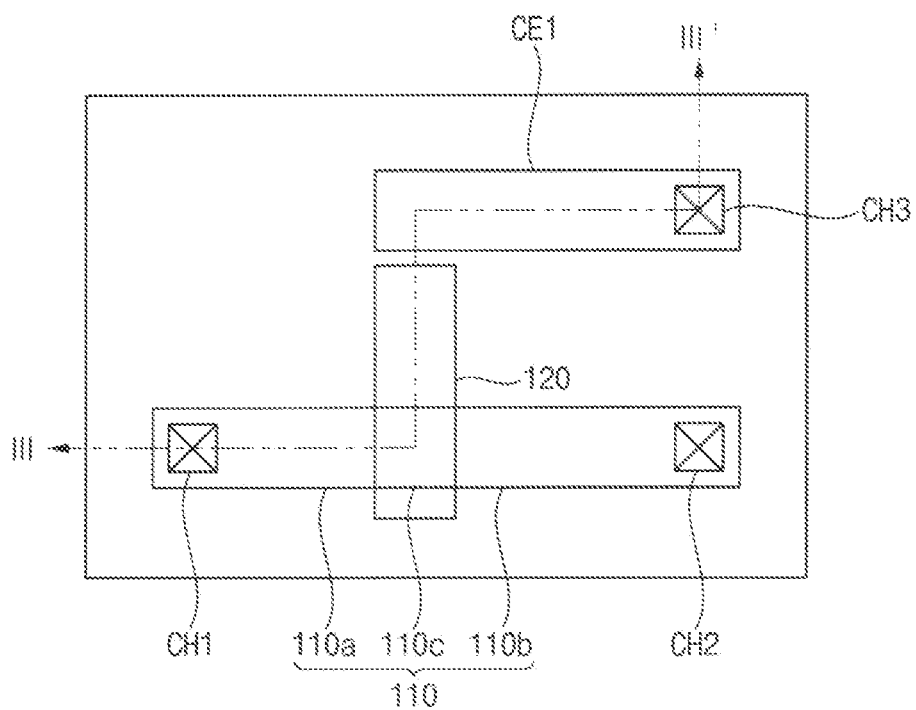
FIGS. 26, 27, 28, 29, 30, and 31 are diagrams illustrating a method of manufacturing a transistor according to an embodiment.
Figure 27:
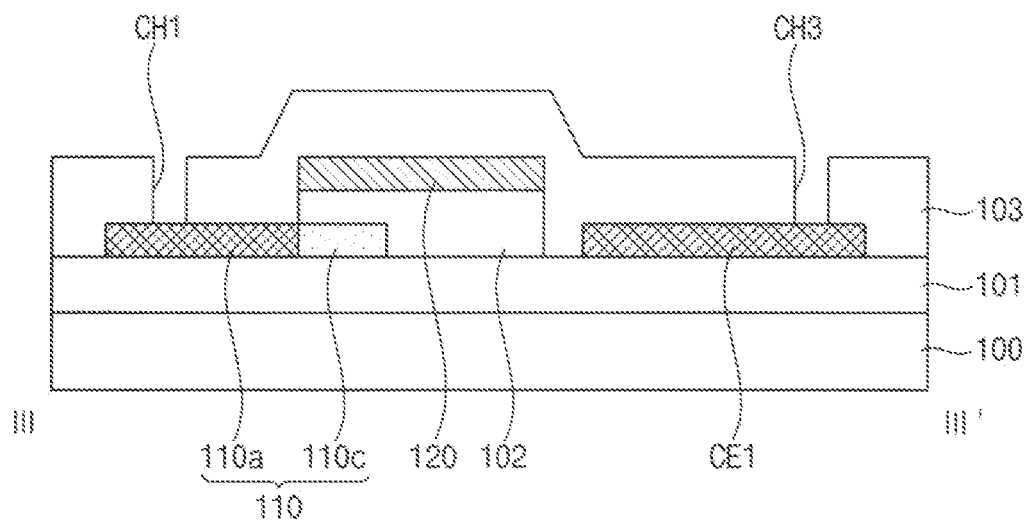

Referring to FIGS. 26 and 27, the interlayer insulating layer 103 may be formed on the gate electrode 120, and the first to third contact holes CH1 to CH3 penetrating the interlayer insulating layer 103 may be formed. The first contact hole CH1 may expose the first region 110a of the active layer 110, and the second contact hole CH2 may expose the second region 110b of the active layer 110. The third contact hole CH3 may expose a first end of the first connection electrode CE1.

Figure 28:
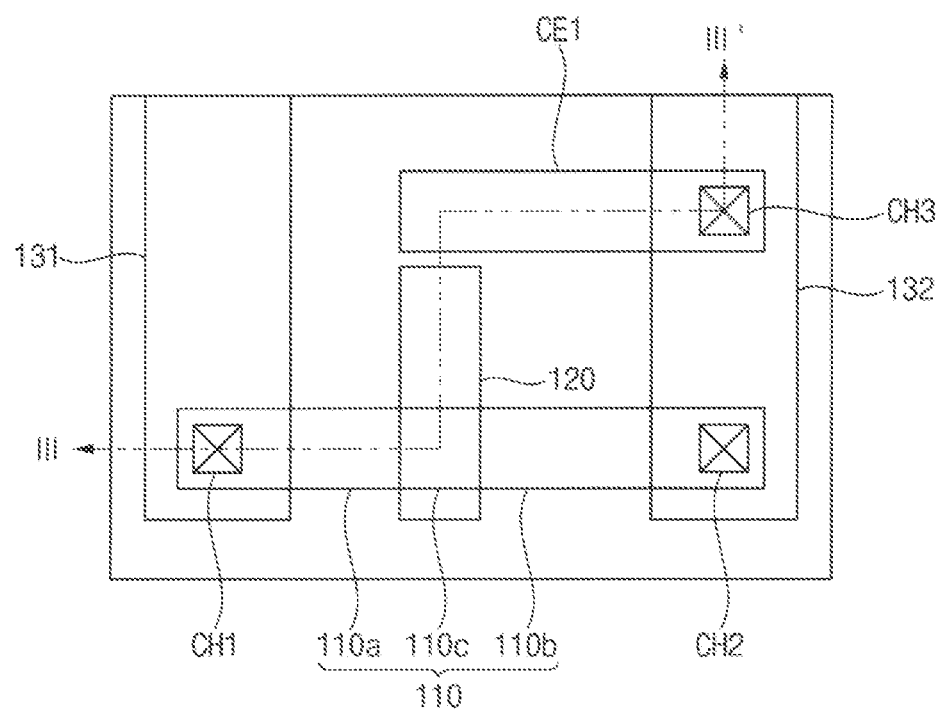
Figure 29:
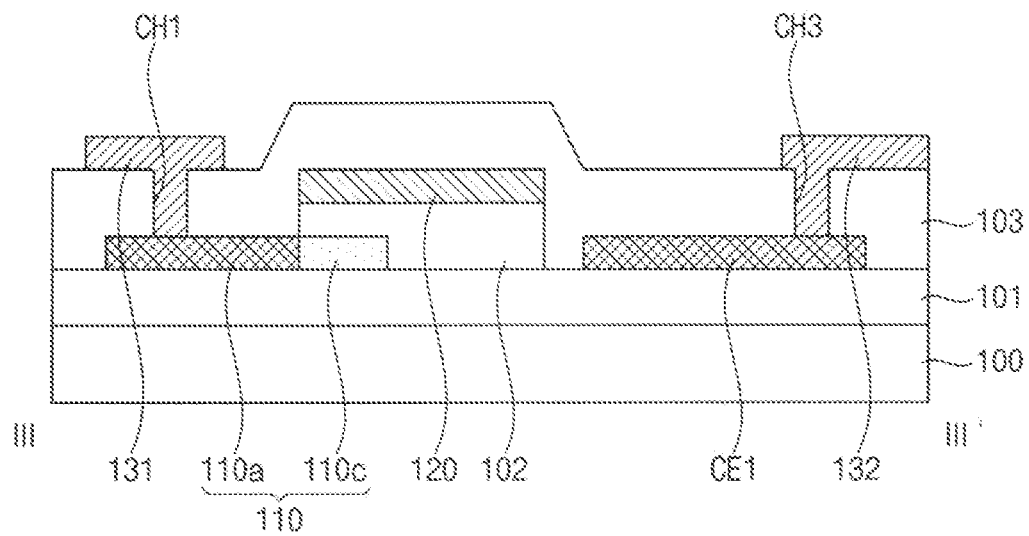

Referring to FIGS. 28 and 29, the first electrode 131 and the second electrode 132 may be formed on the interlayer insulating layer 103. The first electrode 131 may contact the first region 110a of the active layer 110 through the first contact hole CH1. The second electrode 132 may contact the second region 110b of the active layer 110 through the second contact hole CH2, and may contact the first end of the first connection electrode CE1 through the third contact hole CH3. In an embodiment, a metal layer may be formed on the interlayer insulating layer 103, and the metal layer may be patterned to substantially simultaneously form the first electrode 131 and the second electrode 132.

Figure 30:
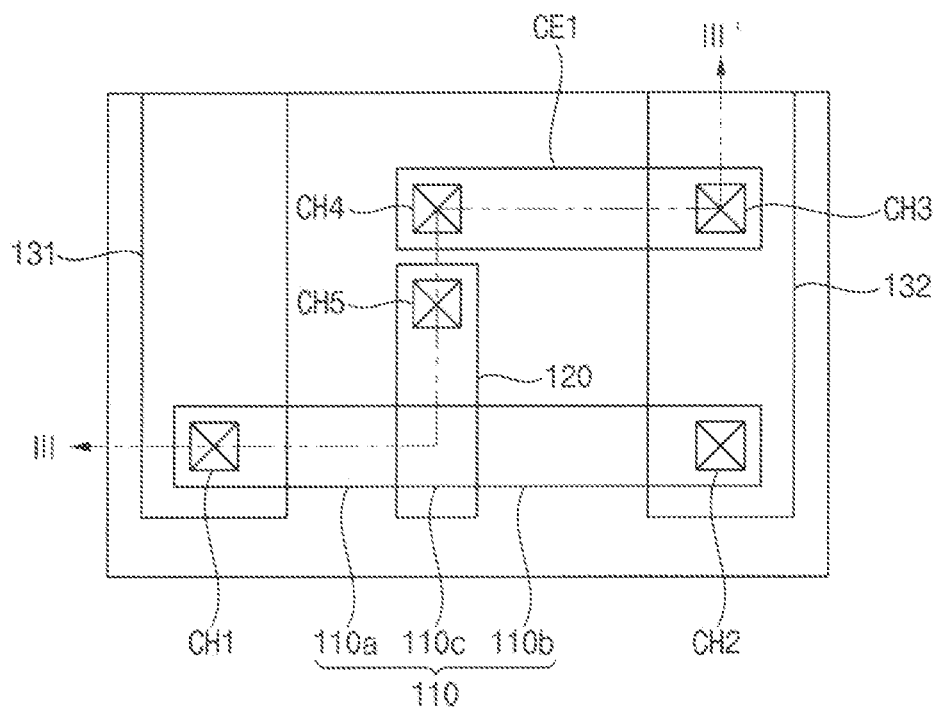
Figure 31:
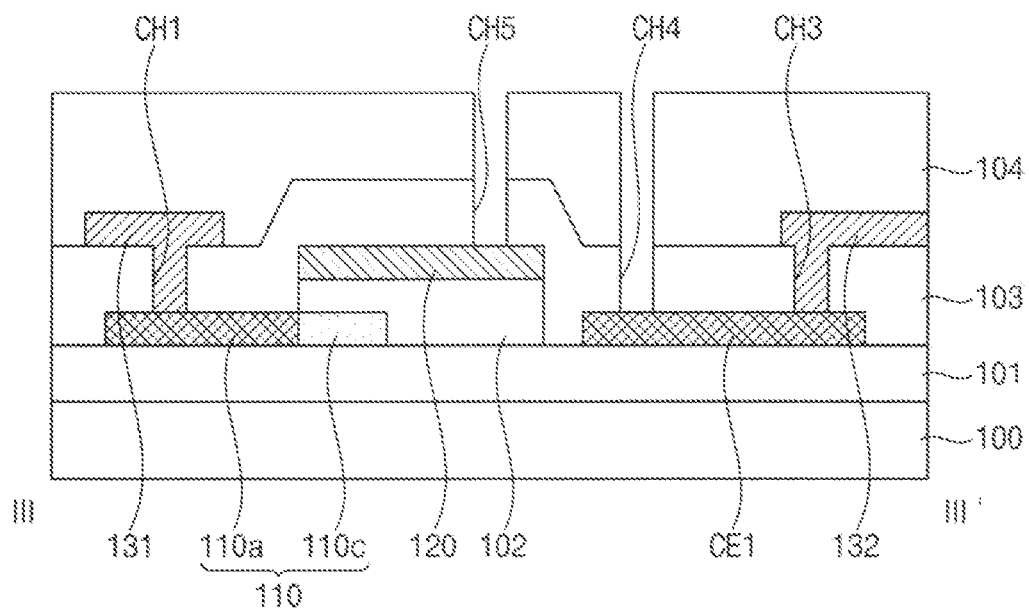

Referring to FIGS. 30 and 31, the planarization layer 104 may be formed on the first electrode 131 and the second electrode 132, and fourth and fifth contact holes CH4 and CH5 penetrating the planarization layer 104 and the interlayer insulating layer 103 may be formed. The fourth contact hole CH4 may expose a second end of the first connection electrode CE1, and the fifth contact hole CH5 may expose the gate electrode 120.

Referring to FIGS. 24 and 25, the second connection electrode CE2 may be formed on the planarization layer 104. The second connection electrode CE2 may contact the second end of the first connection electrode CE1 through the fourth contact hole CH4, and may contact the gate electrode 120 through the fifth contact hole CH5. In an embodiment, a transparent conductive oxide layer may be formed on the planarization layer 104, and the transparent conductive oxide layer may be patterned to form the second connection electrode CE2.

Figure 32:
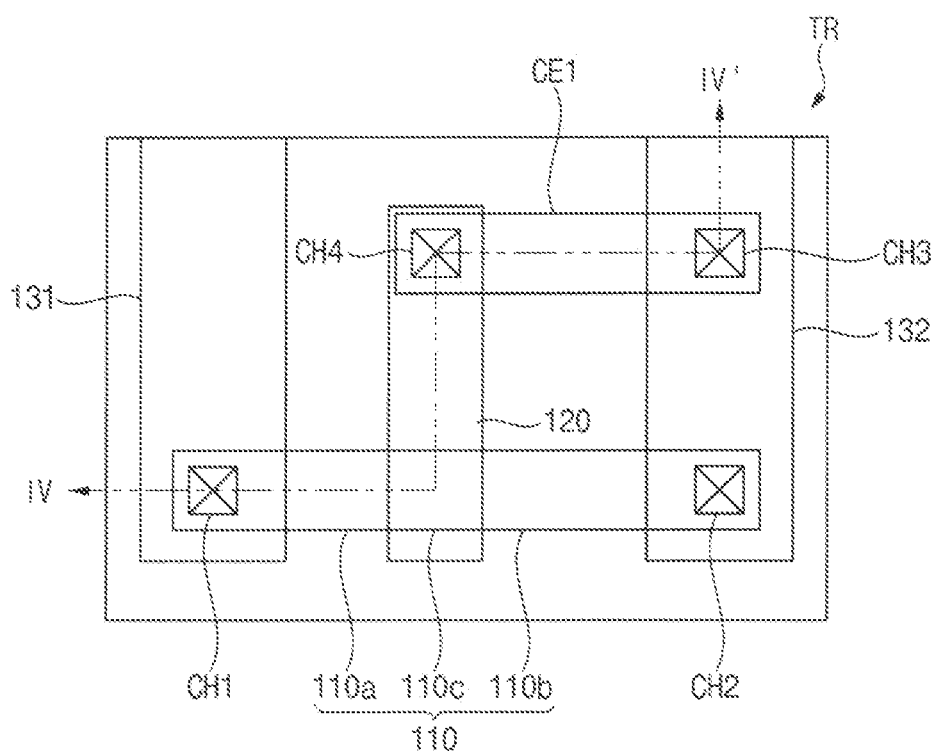
FIG. 32 is a plan view illustrating a transistor according to an embodiment.
Figure 33:
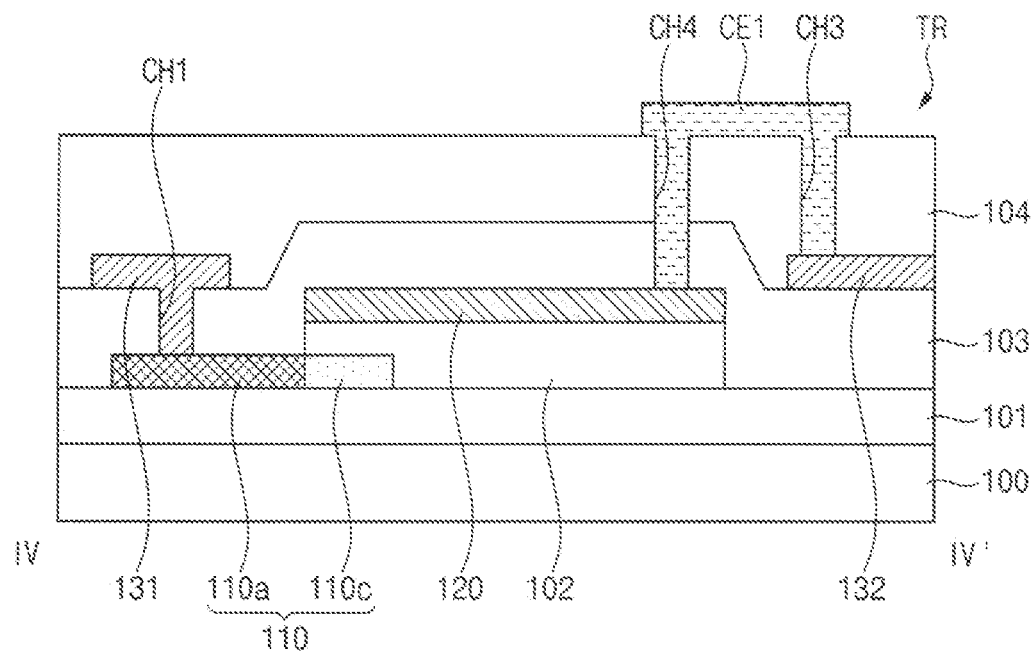
FIG. 33 is a cross-sectional view illustrating the transistor taken along a line IV-IV' in FIG. 32.

FIG. 32 is a plan view illustrating a transistor according to an embodiment. FIG. 33 is a cross-sectional view illustrating the transistor taken along a line IV-IV' in FIG. 32.

Referring to FIGS. 32 and 33, a transistor TR may include an active layer 110, a gate electrode 120, a first electrode 131, a second electrode 132, and a first connection electrode CE1. The transistor TR described with reference to FIGS. 32 and 33 may be substantially the same as or similar to the transistor TR described with reference to FIGS. 7 and 8 except for the position of the first connection electrode CE1 and the omission of the second connection electrode CE2. Accordingly, descriptions of the overlapping components will be omitted.

The first connection electrode CE1 may be disposed on the first electrode 131 and the second electrode 132. In an embodiment, the first connection electrode CE1 may be disposed at the same layer as the pixel electrode 140 in FIG. 4. In other words, the first connection electrode CE1 may be disposed on the planarization layer 104. The first connection electrode CE1 may contact the second electrode 132 through a third contact hole CH3 penetrating the planarization layer 104, and may contact the gate electrode 120 through a fourth contact hole CH4 penetrating the planarization layer 104 and the interlayer insulating layer 103.

In an embodiment, the first connection electrode CE1 may include a transparent conductive oxide. For example, the transparent conductive oxide may include at least one selected from the group including indium-tin oxide (ITO), indium-zinc oxide (IZO), indium oxide (InO), indium-gallium oxide (IGO), and aluminum-zinc oxide (AZO).

In an embodiment, the first connection electrode CE1 may further include a metal as well as the transparent conductive oxide. For example, the metal may include at least one selected from the group including silver (Ag), magnesium (Mg), aluminum (Al), platinum (Pt), lead (Pd), gold (Au), nickel (Ni), niobium (Nd), iridium (Jr), and chromium (Cr).

A resistance of the first connection electrode CE1 may be greater than a resistance of the gate electrode 120. In an embodiment, the first connection electrode CE1 may include a transparent conductive oxide, and the gate electrode 120 may include a metal. In such an embodiment, since a resistivity of the transparent conductive oxide is greater than a resistivity of the metal, the resistance of the first connection electrode CE1 may be greater than the resistance of the gate electrode 120.

Figure 34:
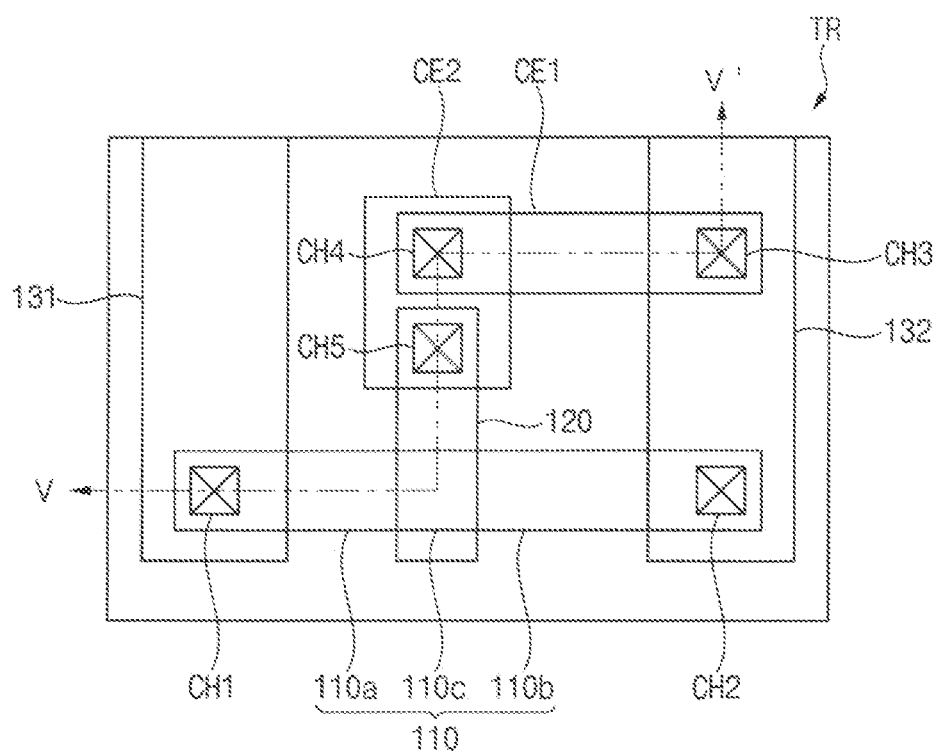
FIG. 34 is a plan view illustrating a transistor according to an embodiment.
Figure 35:
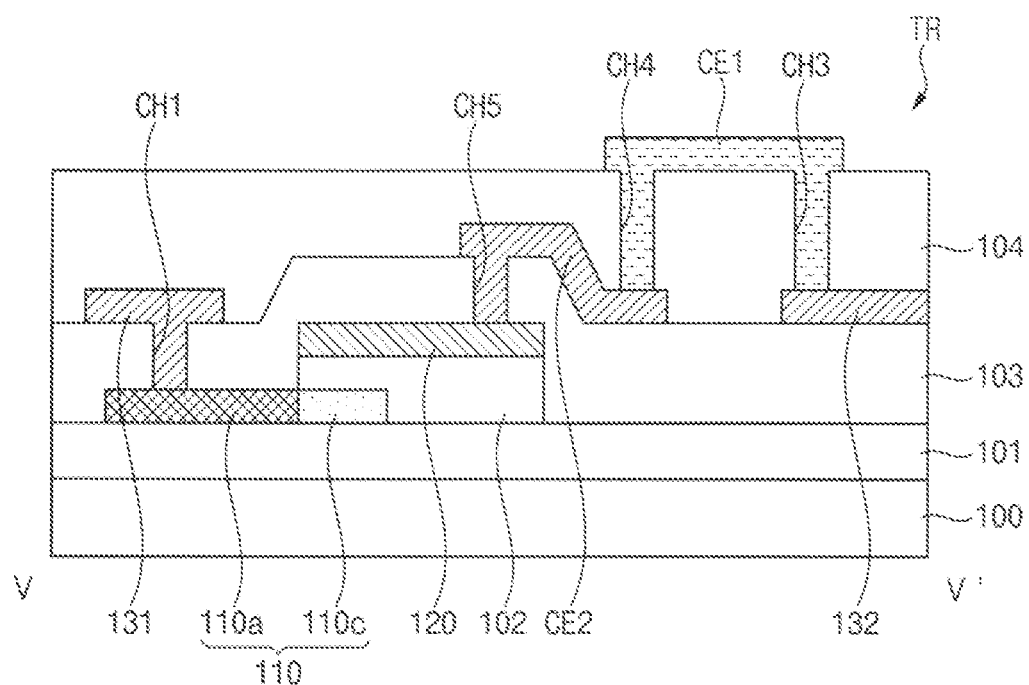
FIG. 35 is a cross-sectional view illustrating the transistor taken along a line V-V' in FIG. 34.

FIG. 34 is a plan view illustrating a transistor according to an embodiment. FIG. 35 is a cross-sectional view illustrating the transistor taken along a line V-V' in FIG. 34.

Referring to FIGS. 34 and 35, a transistor TR may include an active layer 110, a gate electrode 120, a first electrode 131, a second electrode 132, a first connection electrode CE1, and a second connection electrode CE2. The transistor TR described with reference to FIGS. 34 and 35 may be substantially the same as or similar to the transistor TR described with reference to FIGS. 32 and 33 except for the addition of the second connection electrode CE2. Accordingly, descriptions of the overlapping components will be omitted.

The second connection electrode CE2 may be disposed at the same layer as the first electrode 131 and the second electrode 132. In other words, the second connection electrode CE2 may be disposed on the interlayer insulating layer 103. The second connection electrode CE2 may contact the first connection electrode CE1 through a fourth contact hole CH4 penetrating the planarization layer 104, and may contact the gate electrode 120 through a fifth contact hole CH5 penetrating the interlayer insulating layer 103.

In an embodiment, the second connection electrode CE2 may include a metal. For example, the metal may include molybdenum (Mo), aluminum (Al), copper (Cu), titanium (Ti), or the like. The second connection electrode CE2 may have a single-layer structure or a multilayer structure.

The transistor and the display device according to the embodiments may be applied to a display device included in a computer, a notebook, a mobile phone, a smart phone, a smart pad, a PMP, a PDA, an MP3 player, or the like.

Although the transistors and the display devices according to the embodiments have been described with reference to the drawings, the illustrated embodiments are examples, and may be modified and changed by a person having ordinary knowledge in the relevant technical field without departing from the scope and spirit of the following claims.

What is claimed is:
1. A transistor, comprising:
a substrate;
an active layer disposed on the substrate and including a first region, a second region, and a channel region between the first region and the second region;
a gate electrode disposed on the active layer, the gate electrode overlapping the channel region;
a first electrode disposed on the substrate, the first electrode being electrically connected to the first region;
a second electrode disposed on the substrate, the second electrode being electrically connected to the second region; and a first connection electrode disposed on the substrate and electrically connecting the gate electrode and the second electrode, wherein a resistance of the first connection electrode is greater than a resistance of the gate electrode.

2. The transistor of claim 1, wherein the first connection electrode is disposed at a same layer as the active layer.

3. The transistor of claim 2, wherein the first connection electrode includes an oxide semiconductor.

4. The transistor of claim 2, further comprising:
a second connection electrode disposed on the gate electrode, the second connection electrode contacting the first connection electrode and the gate electrode.

5. The transistor of claim 4, wherein the first connection electrode contacts the second connection electrode and the second electrode.

6. The transistor of claim 4, wherein the second connection electrode is disposed at a same layer as the second electrode.

7. The transistor of claim 4, wherein the second connection electrode is disposed on the second electrode.

8. The transistor of claim 2, further comprising:
a dummy pattern disposed at a same layer as the gate electrode, the dummy pattern overlapping a portion of the first connection electrode.

9. The transistor of claim 8, wherein an impurity is not doped in the portion of the first connection electrode.

10. The transistor of claim 1, wherein the first connection electrode is disposed on the second electrode.

11. The transistor of claim 10, wherein the first connection electrode includes a transparent conductive oxide.

12. The transistor of claim 10, wherein the first connection electrode contacts the gate electrode and the second electrode.

13. The transistor of claim 10, further comprising:
a second connection electrode disposed at a same layer as the second electrode, the second connection electrode contacting the gate electrode and the first connection electrode.

14. The transistor of claim 13, wherein the first connection electrode contacts the second connection electrode and the second electrode.

15. A display device, comprising:
a display portion including a substrate and a plurality of pixels disposed on the substrate;
a driver configured to provide a driving signal to the display portion;
a controller configured to provide a control signal to the driver; and
a transistor connected to a connection line connecting the display portion and the driver or connecting the driver and the controller, the transistor including:
an active layer disposed on the substrate and including a first region, a second region, and a channel region between the first region and the second region;
a gate electrode disposed on the active layer, the gate electrode overlapping the channel region;
a first electrode disposed on the substrate, the first electrode being electrically connected to the first region;
a second electrode disposed on the substrate, the second electrode being electrically connected to the second region; and
a first connection electrode disposed on the substrate, the first connection electrode electrically connecting the gate electrode and the second electrode,
wherein a resistance of the first connection electrode is greater than a resistance of the gate electrode.

16. The display device of claim 15, wherein one of the first electrode and the second electrode is connected to the connection line, and
wherein the other of the first electrode and the second electrode is connected to a power voltage line configured to provide a power voltage to the plurality of pixels.

17. The display device of claim 15, wherein each of the plurality of pixels includes:
a pixel electrode disposed on the second electrode;
an emission layer disposed on the pixel electrode; and
an opposite electrode disposed on the emission layer.

18. The display device of claim 17, wherein the transistor further includes:
a second connection electrode disposed on the gate electrode, the second connection electrode contacting the first connection electrode and the gate electrode.

19. The display device of claim 18, wherein the first connection electrode is disposed at a same layer as the active layer, and
wherein the second connection electrode is disposed at a same layer as the second electrode.

20. The display device of claim 18, wherein the first connection electrode is disposed at a same layer as the active layer, and
wherein the second connection electrode is disposed at a same layer as the pixel electrode.

21. The display device of claim 18, wherein the first connection electrode is disposed at a same layer as the pixel electrode, and
wherein the second connection electrode is disposed at a same layer as the second electrode.

22. The display device of claim 17, wherein the first connection electrode is disposed at a same layer as the pixel electrode.

23. The display device of claim 15, wherein the first connection electrode is disposed at a same layer as the active layer or on the second electrode.

* * * * *